(12) United States Patent
Ziabari et al.

(10) Patent No.: US 12,406,104 B2
(45) Date of Patent: Sep. 2, 2025

(54) SYSTEM AND METHOD FOR ARTIFACT REDUCTION OF COMPUTED TOMOGRAPHY RECONSTRUCTION LEVERAGING ARTIFICIAL INTELLIGENCE AND A PRIORI KNOWN MODEL FOR THE OBJECT OF INTEREST

(71) Applicant: UT-Battelle, LLC, Oak Ridge, TN (US)

(72) Inventors: Amir Ziabari, Knoxville, TN (US); Singanallur Venkatakrishnan, Knoxville, TN (US); Philip R. Bingham, Knoxville, TN (US); Michael M. Kirka, Knoxville, TN (US); Vincent C. Paquit, Knoxville, TN (US); Ryan R. Dehoff, Knoxville, TN (US); Abhishek Dubey, Rockville, MD (US)

(73) Assignee: UT-Battelle, LLC, Oak Ridge, TN (US)

( * ) Notice: Subject to any disclaimer, the term of this patent is extended or adjusted under 35 U.S.C. 154(b) by 1066 days.

(21) Appl. No.: 17/392,645

(22) Filed: Aug. 3, 2021

(65) Prior Publication Data
US 2022/0035961 A1 Feb. 3, 2022

Related U.S. Application Data

(60) Provisional application No. 63/060,450, filed on Aug. 3, 2020.

(51) Int. Cl.
G06F 30/10 (2020.01)
G06N 3/045 (2023.01)
(Continued)

(52) U.S. Cl.
CPC ............ *G06F 30/10* (2020.01); *G06N 3/045* (2023.01); *G06T 7/0002* (2013.01); *G06T 19/20* (2013.01); *G06T 2207/10081* (2013.01)

(58) Field of Classification Search
CPC ....... G06F 30/10; G06N 3/045; G06T 7/0002; G06T 19/20; G06T 2207/10081
(Continued)

(56) References Cited

U.S. PATENT DOCUMENTS

| 10,593,070 B2 * | 3/2020 | Lu | A61B 6/5205 |
| 2006/0013353 A1 * | 1/2006 | Hein | G01N 23/046 |
| | | | 378/4 |
| 2018/0014806 A1 * | 1/2018 | Lu | A61B 6/032 |

OTHER PUBLICATIONS

Hierman, G.T., "Correction for beam hardening in computed tomography", Physics in Medicine and Biology, vol. 24, No. 1, 1979, pp. 81-106.
(Continued)

*Primary Examiner* — Andre Pierre Louis
(74) *Attorney, Agent, or Firm* — Warner Norcross + Judd LLP

(57) ABSTRACT

Nondestructive evaluation (NDE) of objects can elucidate impacts of various process parameters and qualification of the object. Computed tomography (CT) enables rapid NDE and characterization of objects. However, CT presents challenges because of artifacts produced by standard reconstruction algorithms. Beam-hardening artifacts especially complicate and adversely impact the process of detecting defects. By leveraging computer-aided design (CAD) models, CT simulations, and a deep-neutral network high-quality CT reconstructions that are affected by noise and beam-hardening can be simulated and used to improve reconstructions. The systems and methods of the present disclosure can
(Continued)

significantly improve the reconstruction quality, thereby enabling better detection of defects compared with the state of the art.

33 Claims, 22 Drawing Sheets

(51) Int. Cl.
*G06T 7/00* (2017.01)
*G06T 19/20* (2011.01)
(58) Field of Classification Search
USPC .......................................................... 703/1, 6
See application file for complete search history.

(56) References Cited

OTHER PUBLICATIONS

Amirkhanov, A. et al., "Projection-Based Metal-Artifact Reduction for Industrial 3D X-ray Computed Tomography", IEEE Transactions on Visualization and Computer Graphics, vol. 17, No. 12, Dec. 2011, pp. 2193-2202.
Jin, P. et al., "A Model-Based Image Reconstruction Algorithm With Simultaneous Beam Hardening Correction for X-Ray CT", IEEE Transactions on Computational Imaging, vol. 1, No. 3., Sep. 2015, pp. 200-216.
Champley, K.M. et al., "Efficient and Accurate Correction of Beam Hardening Artifacts", Lawrence Livermore National Laboratory, Feb. 10, 2014, presented at The Third International Conference on Image Formation in X-Ray Computed Tomography Jun. 22-25, 2014, pp. 1-7.
Pauwels, R. et al., "Exploratory research into reduction of scatter and beam hardening in industrial computed tomography using convolutional neural networks", 9th Conference on Industrial Computed Tomography, 2019, pp. 1-8.
Zhang, Y. et al., "Convolutional Neural Network Based Metal Artifact Reduction in X-Ray Computed Tomography", IEEE Transactions on Medical Imaging, vol. 37, No. 6, Jun. 2018, pp. 1370-1381.
Ghani, M.U. et al., "Deep Learning Based Sinogram Correction for Metal Artifact Reduction", Department of Electrical and Computer Engineering, Boston University, Jan. 2018, pp. 1-9.
Lee, D. et al., "A Metal Artifact Reduction Method Using a Fully Convolutional Network in the Sinogram and Image Domains for Dental Computed Tomography", Society for Imaging Informatics in Medicine, 2019, pp. 538-546.
Gjesteby, L. et al., "Deep learning methods to guide CT image reconstruction and reduce metal artifacts", Proceedings of SPIE, SPIE Medical Imaging, 2017, pp. 1-8.
Park, H.S. et al., "CT sinogram-consistency learning for metal-induced beam hardening correction", Physics-Med, Jan. 12, 2018, pp. 1-17.
Van De Casteele, E. et al., "An energy-based beam hardening model in tomography", Institute of Physics Publishing, Physics in Medicine and Biology, vol. 47, 2002, pp. 4181-4190.

\* cited by examiner

SYSTEM AND METHOD FOR ARTIFACT REDUCTION OF COMPUTED TOMOGRAPHY RECONSTRUCTION LEVERAGING ARTIFICIAL INTELLIGENCE AND A PRIORI KNOWN MODEL FOR THE OBJECT OF INTEREST

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

FIELD OF THE INVENTION

The present invention relates to systems and methods for reducing artifacts in computed tomography reconstructions.

BACKGROUND OF THE INVENTION

X-ray computed tomography (XCT) involves taking x-ray images of a sample at different angles (see FIG. 3), normalizing the images, and computationally processing them using an algorithm to obtain a 3D reconstruction. The most commonly used algorithms make the assumption that the normalized data is linearly related to the unknown 3D object—an assumption that is valid when the x-ray source is monochromatic or when the sample is made up of relatively lighter elements if the source is polychromatic. In practice, however, the lower-energy photons in a polychromatic beam are absorbed more easily than the higher-energy photons, which harden the x-ray spectrum as it passes through the object. This effect, called "beam hardening", breaks the fundamental assumption of linearity implicit in common CT reconstruction algorithms, thereby causing artifacts such as cupping (lower values for the reconstruction in the central regions) and streaking in reconstructed CT images (see FIGS. 1A-1B for examples of these artifacts). This phenomenon is more prominent for heavy elements or high-density materials such as metals, which are primarily used in metal additive manufacturing (AM) applications such as printing turbine blades for the aviation industry. Beam hardening-induced artifacts make inference tasks such as detecting pores much more complicated; therefore, there is a need for fast algorithms and methods to handle such data.

The topic of beam hardening and how to deal with it has been studied for several decades, dating back to the development of XCT itself. One approach to dealing with beam hardening is to physically filter out the low energies of the x-ray spectrum using a filter and then reconstruct the data using standard algorithms. However, this hardware-based approach requires the manufacturing of well-calibrated filters that depend on the x-ray source spectrum and the materials being scanned. Furthermore, such filters lower the overall flux of the source, thereby increasing scan times or lowering the signal-to-noise ratio of the data. Another popular set of approaches involves the design of novel algorithms to computationally suppress artifacts that emerge as a result of beam hardening. These approaches can be broadly classified as those applicable to single-material and those applicable to multi-material samples. For single-material cases, one class of approaches involves designing a calibration sample of the same material as the object of interest and teaching a digital filter (such as a polynomial) to transform the data, effectively linearizing the data and then processing the linearized data using a standard reconstruction algorithm. Such a digital filter can also be empirically determined by finding the polynomial that, when applied to the projections, results in a visually pleasing tomographic reconstruction. One general example of this technique is described in FIG. 13. Specifically, FIG. 13 illustrates how offline calibration for beam hardening in different materials can be utilized to obtain a polychromatic beam curve (either measurement or physics models). Subsequently, a polynomial can linearize the curve and estimate the corresponding monochromatic curve. This technique only learns to map some projection numbers before reconstruction, that is it only attempts to correct the projection before reconstruction. Further, this technique does not use or account for any characteristics of beam hardening, either in the image or projection domain. And, it is limited by the specific reconstruction technique applied.

For samples composed of multiple materials, several algorithms have been developed that involve identifying the regions of different materials and correcting for each of these separately. For example, the method of FIG. 14 describes a projection-based metal-artifact reduction (MAR) algorithm. In general, this prior art approach involves conducting a CT scan of an object, reconstructing the 3D volume, and then segmenting the 3D volume to identify the high-density portions. These portions typically are metal regions. Those identified regions are subtracted from the original measured projection volume and then filled in with interpolation or inpainting. This technique has a number of shortcomings that make it less viable for a number of practical applications. The intermediate steps (e.g. segmentation and interpolation) are limited to specific cases and prone to produce artifacts and errors. Further, this technique does not work for complex geometries where the entire part is composed of dense material such as in metal additive manufacturing, or any other case where the 3D volume cannot be easily and meaningfully segmented. Also, it is generally useless when trying to reduce artifacts that can be smeared due to beam hardening in CT reconstruction. For example, cracks, pores, and small inclusions can often be masked or hidden by beam hardening causing these defects to smear during reconstruction. This is particularly often the case with additive manufactured parts. In essence, this type of algorithm can lead to a reconstructed image that does not represent reality because the defects that are actually present are not present in the final reconstruction. Some MAR algorithms have attempted to use CAD models to improve the segmentation, but that typically is only helpful if the volume is made from soft materials, such that dense materials can be segmented easily. And, it requires an almost perfect registration between CAD and real data, which from a practical perspective is difficult, if not impossible, to expect in practical applications, such as in metal additive manufacturing.

Recently, there has been work on developing deep learning-based techniques to address beam hardening artifacts. Exploratory research into reduction of scatter and beam hardening in industrial computed tomography has been performed using a convolutional neural network to attempt to remove artifacts from the data itself by training on simulated pairs of mono-energetic and polychromatic data. Others have attempted to address streak artifacts due to strongly attenuating materials embedded inside a larger object (a multi-material case) in the context of medical CT using a deep neural network (DNN) approach. Others have attempted to use a data and image domain convolutional neural network (CNN) to remove metal artifacts in dentistry XCT (another example of the multi-material approach). One example of this type of deep learning-based technique to address beam hardening artifacts is illustrated in FIG. 15. In general, this approach relies on curated data sets of pairs of measured CT data with beam hardening present along with the same data set where beam hardening was removed. That is, these algorithms require large data sets of CT scans where beam hardening has already been fixed so that the deep learning network can be trained appropriately. These approaches have a number of shortcomings. Perhaps most significantly, they require real measurement data that has already been beam hardening corrected and appropriately labeled in order to train, which comes at a significant cost in terms of labor and costs. Further, the reconstruction can only be as good as the training data supports because there is no ground truth available for these techniques. Although deep learning approaches have recently emerged that show promising results for multi-material XCT mainly in the context of medical XCT there is ample room for improvement in systems and methods for CT artifact reduction.

SUMMARY OF THE INVENTION

The present invention provides a system and method for leveraging computer-aided design (CAD) models, including digital twins and synthetically generated simulations, along with physics-based parameters to simulate realistic computed tomography (CT) and artifacts, such as beam-hardening and detector noise. A deep convolutional neural network or other artificial intelligence network can be trained on synthetically generated data based on the CAD models to reduce artifacts in CT reconstructed images.

One embodiment of the present disclosure is generally directed to an artifact reduction artificial intelligence training system for computed tomography (CT) of an object of interest. The system includes a computer-aided design (CAD) model representing the object of interest, stored in memory, an artifact characterization, stored in memory, along with one or more computer subsystems and components executed by the one or more computer subsystems. The components include a CT simulator to generate CT simulated projections based on the CAD model. Some of the CT simulated projections include simulated artifacts based on the artifact characterization and some do not. That is, the same simulation is performed twice: once to produce projections with artifacts and once to produce projections without artifacts. These simulations can be used as pairs of inputs to a deep learning network which attempts to learn the non-linear mapping between the projections with artifacts and the projections without artifacts, thereby learning to reduce such artifacts. A deep learning component can also be included that is configured to train a deep learning artifact reduction model based on the CT simulated projections and generate a set of deep learning artifact reduction model parameters. The trained model can be deployed and applied to real CT scan data to reduce artifacts in CT reconstructed images.

In another embodiment, CAD models of various geometries are simulated with various defects and various artifacts. The artifacts can be simulated based on calibration or physics-based modeling. For example, beam hardening parameter estimation of materials can be utilized in some embodiments to simulate beam hardening artifacts for training purposes. Simulation of CT utilizing the CAD models and the calibration and/or physics-based artifact models are used to generate synthetic training data sets. The synthetic training sets are used to train a deep learning module. The deep learning-based approach can be modular, meaning it is not limited to the network employed/demonstrated in this disclosure. A model trained on synthetic data can be tested or deployed on real (measured) data sets. Accordingly, high quality CT reconstructions can be provided that leverage CAD models with simulated defects/artifacts and synthetically trained AI.

Computed tomography enables non-destructive evaluation including flaw or defect detection and inspection, failure analysis, and assembly analysis in advanced manufacturing, automotive, aerospace, and casting industries, as well as other industries. CT of thick dense parts, such as metal parts, is especially challenging due to the effect called beam-hardening that produces artifacts in the images reconstructed by standard algorithms. Beam hardening complicates the process of detection of defects (e.g., pores, cracks, and inclusions) in CT images; which in turn adversely impacts qualification of manufactured parts. The present disclosure provides a system and method for improving CT resolution by suppressing, reducing, or removing artifacts, such as beam hardening and detector noise artifacts. Embodiments of the system and method can also reduce CT scan time, thus lowering associated labor and costs.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

DESCRIPTION OF THE CURRENT EMBODIMENT

Figures 1A, 1B:
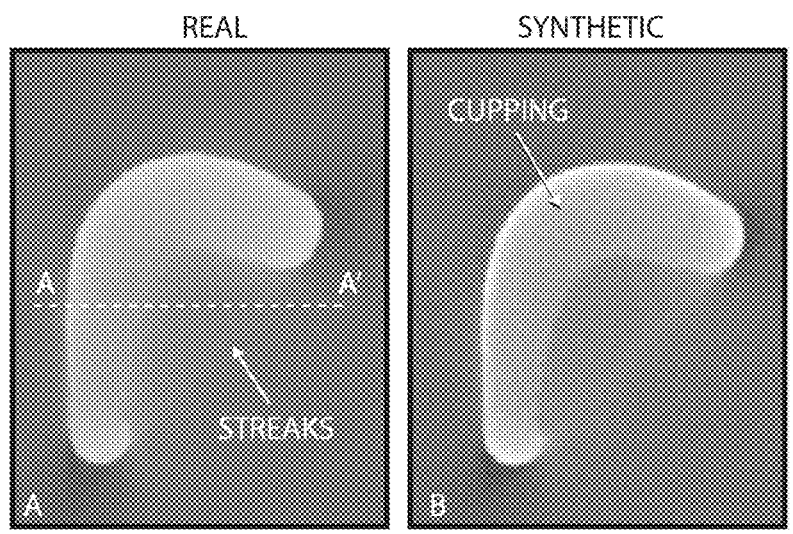
FIG. 1A shows a cross section from the reconstruction of a jet engine turbine blade from a real x-ray CT scan.
FIG. 1B shows a cross section from the reconstruction of a jet engine turbine blade from a simulated x-ray CT scan.

The present disclosure is generally directed to a novel framework based on using computer aided design (CAD) models, i.e., a priori known model, for an object of interest, accurate computed tomography (CT) simulations, and a deep neural network (DNN) to produce high-quality CT reconstructions from data that has been synthetically produced to include simulated artifacts caused by CT scanning, such as detector noise and beam hardening. In particular, many of the embodiments of systems and methods of the present disclosure involve CAD models of the parts, introduction of typical defects, and simulation of CT measurements that include a model for beam hardening and detector noise. These simulated measurements can be processed with common CT reconstruction algorithms, which result in artifacts. Then, a deep learning model can be trained on the pairs of reconstructed volumes, with artifacts and ground truths derived from the CAD model, to learn a fast, nonlinear mapping function. The deep learning component/method teaches the model how to suppress the beam hardening artifacts and noise from the reconstructed volumes. Once the mapping is learned on the simulated measurements, the trained model can be used to rapidly process new, non-simulated data and produce reconstructions by effectively suppressing artifacts the model was trained to reduce, such as detector noise and beam hardening artifacts.

Before describing several exemplary embodiments of systems and methods in accordance with various aspects of the present disclosure, it should generally be understood that the systems and methods of the present disclosure can include and can be implemented on or in connection with one or more computers, microcontrollers, microprocessors, and/or other programmable electronics that are programmed to carry out the functions described herein. The systems may additionally or alternatively include other electronic components that are programmed to carry out the functions described herein, or that support the computers, microcontrollers, microprocessors, and/or other electronics. The other electronic components can include, but are not limited to, one or more field programmable gate arrays, systems on a chip, volatile or nonvolatile memory, discrete circuitry, integrated circuits, application specific integrated circuits (ASICs) and/or other hardware, software, or firmware. Such components can be physically configured in any suitable manner, such as by mounting them to one or more circuit boards, or arranging them in another manner, whether combined into a single unit or distributed across multiple units. Such components may be physically distributed in different positions in an embedded system, such as an CT scanning system, or they may reside in a common location. The trained DNN model and supporting functionality can be integrated into electronic components that work in concert with the CT scanner to reconstruct real CT projection data into CT reconstructed images with artifact reduction. The training functionality may or may not be included in the CT scanner with the ability to train additional geometries. In some embodiments, a training system can be provided on a general purpose computer or within a dedicated hardware framework. When physically distributed, the components may communicate using any suitable serial or parallel communication protocol, such as, but not limited to SCI, WiFi, Bluetooth, FireWire, I2C, RS-232, RS-485, and Universal Serial Bus (USB).

Figure 16:
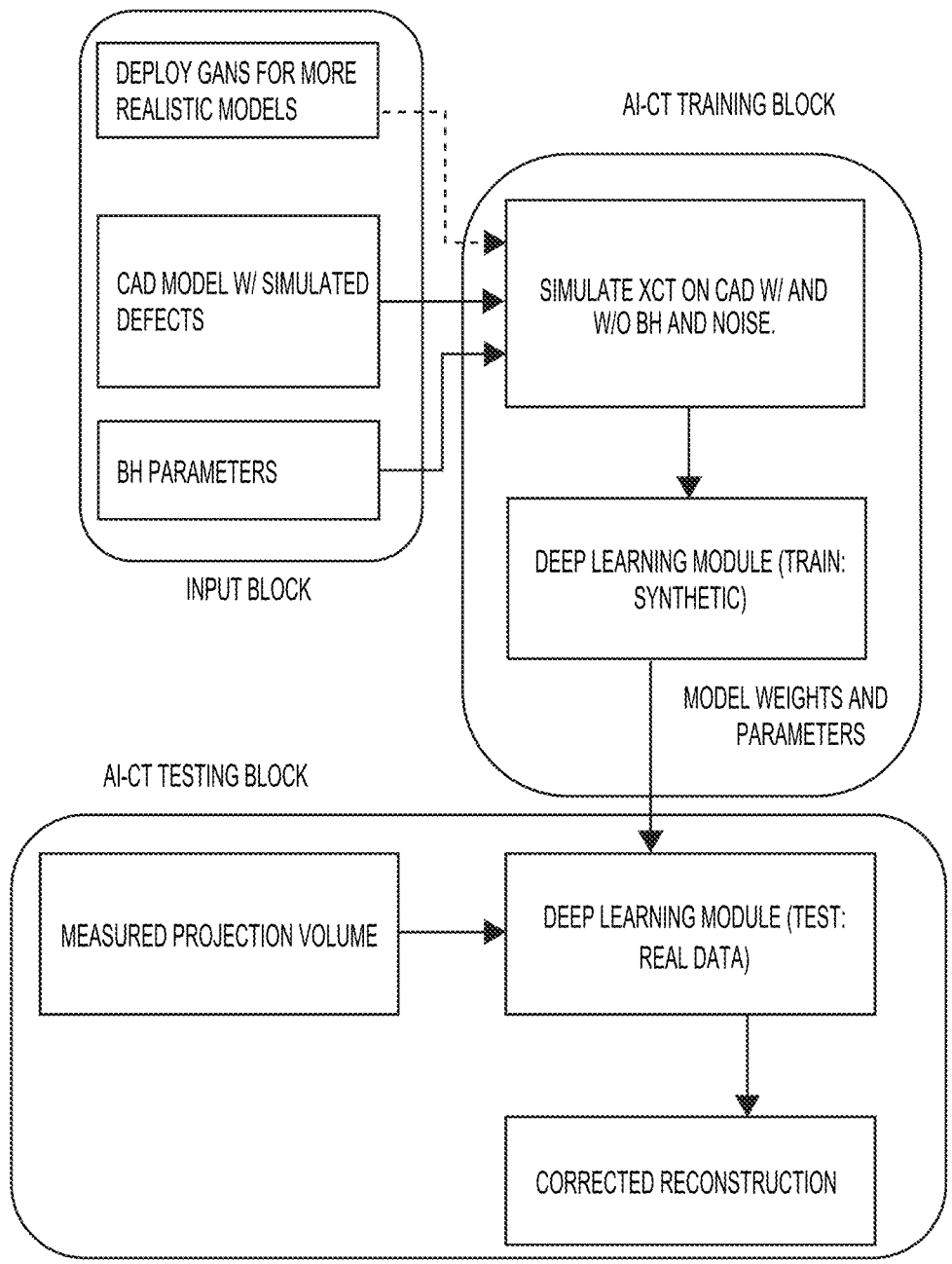
FIG. 16 shows one embodiment of the present disclosure leveraging CAD models and deep learning to remove beam hardening.

One exemplary embodiment of a system and method of leveraging CAD models and artificial intelligence, such as a deep learning model, to reduce artifacts in CT reconstructions is illustrated in FIG. 16 and will now be described in detail. The system and method can be described generally in connection with three blocks: an input block, a training block, and a testing/deployment block. In general, the input block provides CAD models with simulated defects along with artifact parameters (e.g., beam hardening calibration parameters and detector noise parameters) for simulating artifacts generated by a CT scan to the training block. The training block processes the CAD models with simulated defects that it receives by simulating the CT scan. In some embodiments, the training block simulates a set of CT projections that simulate artifacts created by a real CT scan based on the artifact parameters provided to the training block and also simulates a set of CT projections without the artifact parameters. In this way, the CT projections without accounting for the CT artifacts can be labeled as the desired output of the AI network while the CT projections simulated with CT artifacts can be labeled as input of the AI network. Data pairs of these sets of data can be provided to a deep learning component for it to train a deep learning artificial intelligence model. That is, the deep learning component is configured to train the deep learning model on synthetic data such that the trained model can be used in connection with transfer learning to real data. In some embodiments the transfer learning is trivial because the real CT scan data and the simulated CT scan data can be provided in the same format to the trained AI model such that the AI model can provide its estimation in the form of either a reconstruction correction for reducing artifacts that can be applied to the output of a conventional reconstruction algorithm or in the form of a complete reconstructed image with artifact reduction. As discussed in more detail below in connection with FIGS. 18 and 19, the deep learning approach can be modular. The deep learning approach can be conducted in the projection/sinogram domain (see FIG. 19) or in the image domain (see FIG. 18). This allows for adaptability and future proofing because the deep learning methods can be replaced with state-of-the-art updates without loss of generality. In some embodiments, the CAD model with simulated defects can be labeled as ground truth. In other embodiments, a different model can be provided or defined in the system as ground truth, or the system can be operated without a labeled ground truth. In some embodiments, improved image reconstruction is ultimately provided as the deep learning network learns to map to the ground truth.

Some embodiments of the systems and methods of the present disclosure, including the embodiment depicted in FIG. 16, provide several significant benefits. Using synthetic data for training prohibits the need for large data sets of real data. CAD models can be used to simulate artifacts caused by CT scanning, such as detector noise and/or beam hardening. Further, other computational, machine learning and deep learning methods can be used in combination with embodiments of the systems and methods of the present disclosure. For example, as will be discussed in more detail below in connection with FIG. 17, generative adversarial networks or other deep generative networks can be deployed to improve this CT reconstruction system and method further. For example, by modeling detailed features using physics-based models or information from other modalities (e.g., scanning electronic microscopy (SEM) images or other data or transmission electron microcopy (TEM) images or other data), the underlying CAD models upon which this overarching system and method are based can be improved, which in turn can improve the quality and efficiency of the CT reconstruction and artifact reduction.

The improved reconstruction results provided by systems and methods of the present disclosure not only can assist in reducing artifacts, but can also assist in providing CT computed tomography reconstructions with better resolution, which in turn can allow for better analysis of object of interest.

Further, compared to other methods, embodiments of the proposed systems and methods can include prior information about the object of interest by including CAD models, however the CAD models need not perfectly match or register to the object of interest that is ultimately scanned when the model is deployed. That is, while there is some reliance on the training CAD models bearing similarity/resemblance to the ultimate object of interest that is being scanned for use with the deployed model, the amount of similarity can vary depending on the application, context, expectations, speed, and other factors. The CAD model may even be for a different version or model of the object of interest that has overlapping features.

The systems and methods of the present disclosure can also work across different domains.

Some embodiments of the deep neural network (DNN) can reconstruct a 3D volume using a 2.5 dimension (2.5D) scheme by which each slice is reconstructed from multiple slices of the input to exploit correlations between adjacent slices. This approach is in contrast to most deep learning approaches that either work with 2D images or are too expensive for use in processing entire 3D volumes. This approach allows high-quality 3D reconstruction much faster than state-of-the-art methods. In this disclosure, simulated and experimental data sets highlight the benefits of this technique compared with some existing approaches. Further, this disclosure provides an evaluation of the network, trained on synthetic data only, on experimental CT data sets and demonstrates results in comparison with standard reconstructions obtained from a commercial x-ray CT system at the Manufacturing Demonstration Facility (MDF) at Oak Ridge National Laboratory (ORNL).

Another embodiment of the present disclosure will now be described in connection with FIG. 18. This embodiment illustrates an example of modulatory of the current system and method where image domain deep learning for beam hardening artifact removal or reduction is highlighted. The input block, just as in FIG. 16, can provide CAD models and artifact characterization (e.g., beam hardening and noise characterizations that include one or more parameters) to an image domain training block. Just as in the FIG. 16 embodiment, the CAD and artifact characterization are utilized with physics-based software to simulate a CT scan on the CAD model to produce CT data sets including subsets of data that represent a CT scan of the CAD model with beam hardening and noise and subsets of data that represent a CT scan of the CAD model without beam hardening and noise. The number and variations of CT projection data that is prepared for the AI training block can vary depending on a wide variety of factors including the amount of time available to train the AI, memory, heuristics, desired training level of the AI, and other factors. Once suitable simulated CT projection data has been generated, the AI model can be trained. In this embodiment, the training begins with reconstructing input CT volumes so that the deep learning network can be trained on the reconstructed images. In the current embodiment, an example of a deep learning network for an image domain artifact removal is illustrated. It should be understood that this network could be replaced with any novel image domain deep learning network for artifact removal. In the depiction, on the right side of FIG. 18, the (Feldkamp-Davis-Kress)

FDK analytical algorithm is used to produce input reconstructed images from the projection data with artifacts, including artifacts that arise due to the CT scan, such as noise artifacts, beam-hardening artifacts, and artifacts that arise due to shorter scanning, to name a few examples. The network is configured to feed several batches of five slices of FDK reconstructed images through the layers of the artifact reduction DNN of the present disclosure to produce a residual data set representing the artifacts in the reconstructed FDK data. In the training phase of the deep learning network, in an iterative manner, the residual data is subtracted from the same input fed to the network and compared against the ground truth, through minimization of a cost function, until it approximates or is equivalent to the ground truth. In general, this will produce a computed tomography reconstruction that represents the object of interest without the simulated artifacts produced by the simulated CT scan, but with any simulated defects remaining from the original CAD model with simulated defects. When deployed (i.e., when the deep learning network is used in a non-training, live environment on real CT data of objects of interest that the system likely did not train on), the application of the model can work similarly, but because there is not typically any access to the ground truth, the CT correction is applied by subtracting the residual image representing the CT artifacts from the reconstructed image (FDK reconstruction of the real data) fed to the deep learning network, and approximate a high quality reconstruction with better resolution and defect detection capability. For clarity, defect detection capability refers to the ability to detect actual defects present in the object of interest. This defect detection capability can be increased by the system and method of the present disclosure due to the artifact reduction in the resultant high-quality reconstruction. That is, the artifacts (e.g., due to the CT scan, such as noise, beam-hardening, and scan time) that are being reduced by embodiments of the present disclosure can, to the extent they are present, mask or interfere with the representation of defects in the reconstruction of the object of interest. By reducing or removing the artifacts, the resolution of the imaging system and the detectability of those defects in the underlying object of interest is increased.

The trained image domain artifact reduction model can be deployed or tested with measured projection data from an actual CT scan of an object of interest. Because the AI is trained in the image domain, an analytical reconstruction of the projection volume is performed. The reconstruction can be used to test the deep learning network in the image domain by subtracting the residual (correction) output of the trained AI applied to the analytical CT reconstruction of the measured projection data, or in the case where the trained AI is configured to provide an entire reconstructed CT image of an artifact reduced measured projection volume, that can be output as the corrected reconstruction. That is, while the embodiments of the present disclosure that relate to the image domain utilize the DNN to output a reconstruction correction that can be applied to the image output of a conventional reconstruction algorithm, it is also viable to train the DNN between a low quality reconstruction and a high quality artifact-reduced reconstruction.

Figure 19:
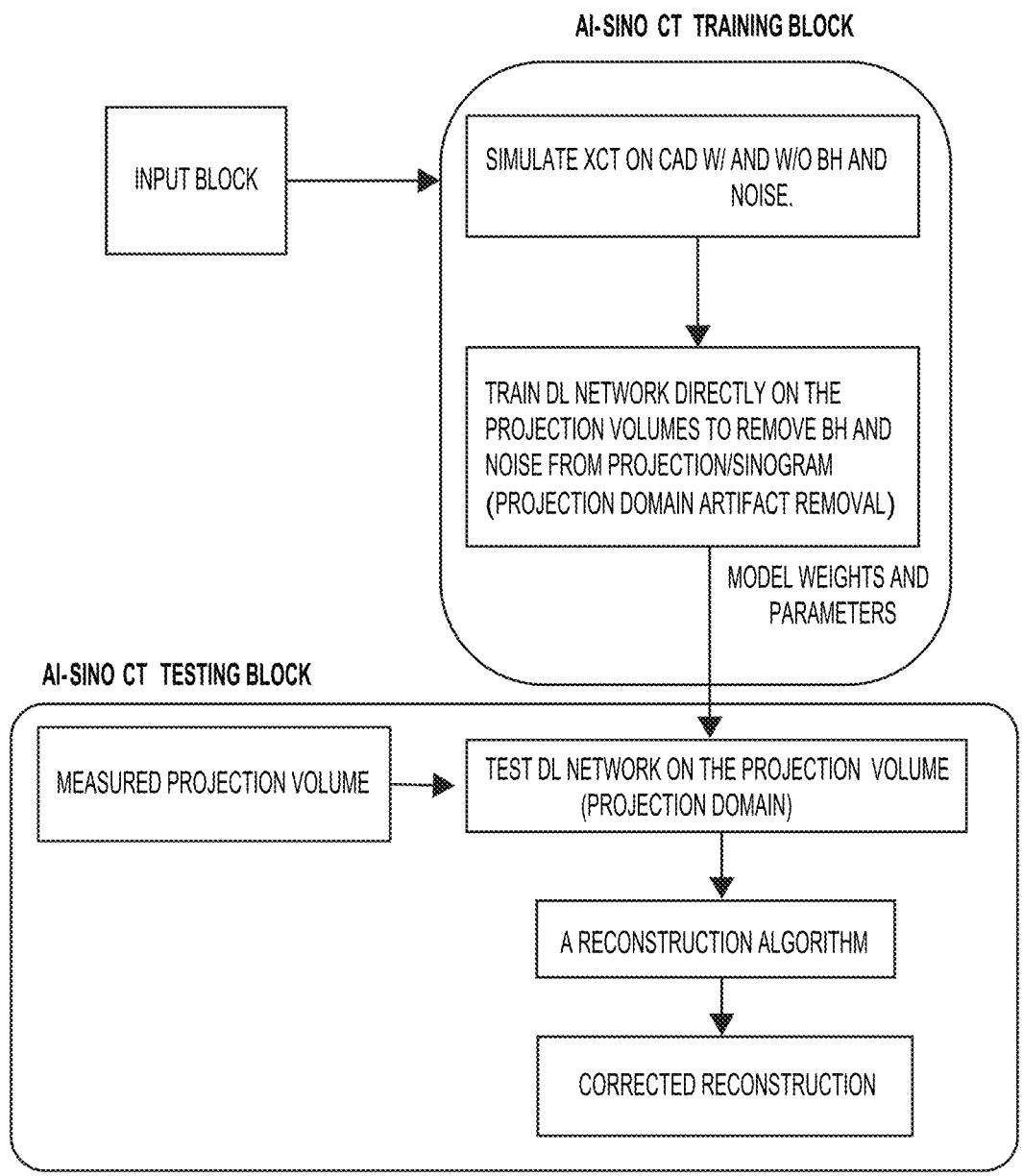
FIG. 19 shows one embodiment of the present disclosure utilizing sinogram domain deep learning for beam hardening artifact removal.

Another embodiment of the present disclosure will now be described in connection with FIG. 19. This embodiment illustrates another example of modulatory of the current system and method where sinogram (projection) domain deep learning for beam hardening artifact removal or reduction is highlighted. The input block, just as in FIGS. 16-17, can provide CAD models and artifact characterization (e.g. beam hardening and noise characterizations that include one or more parameters) to an image domain training block, in this case an AI-SinoCT training block. Just as in the FIGS. 16-17 embodiments, the CAD and artifact characterization are utilized with physics-based software to simulate a CT scan on the CAD model to produce CT data sets including subsets of data that represent a CT scan of the CAD model with beam hardening and noise and subsets of data that represent a CT scan of the CAD model without beam hardening and noise. Once suitable simulated CT projection data has been generated, the AI model can be trained. In this embodiment, because it occurs in the projection or sinogram domain, the training skips reconstruction and trains directly on the projection volumes to reduce artifacts, in this case beam hardening and detector noise artifacts. Removing beam hardening artifacts from the projection or sinogram helps to avoid reliance on an initial reconstruction for image domain data can result in a higher quality reconstruction.

Figure 18:
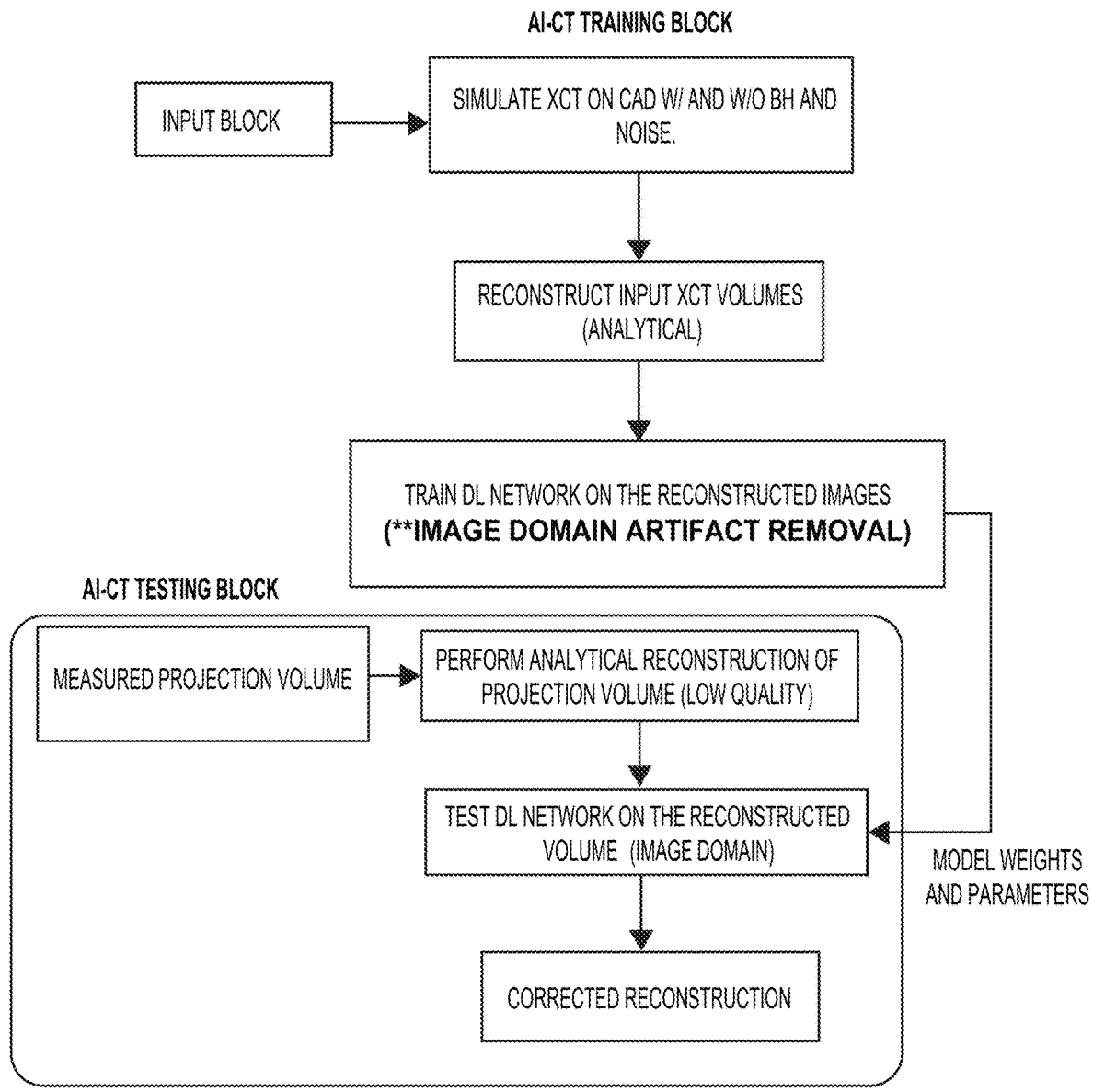
FIG. 18 shows one embodiment of the present disclosure utilizing image domain deep learning for beam hardening artifact removal.

Just as in FIGS. 16 and 18, the trained artifact reduction model can be deployed or tested with measured projection data from an actual CT scan of an object of interest. Because the AI is trained in the projection domain, no analytical reconstruction of the projection volume needs to be performed before the correction is applied. Instead, the deep learning network operates directly on the projection volume obtained from the real scan of the object of interest in order to reduce the artifacts. Then, once the projection volume has had the reconstruction artifact correction applied, the corrected projection can be reconstructed utilizing essentially any reconstruction algorithm.

Throughout this disclosure reference is made to an object of interest. Various different terms may be used to refer to the object of interest. In general, the object of interest refers to the object that is or will be subject to a CT scan. For example, the object of interest may be referred to simply as a part, article, sample, item, object, or another high-level term referencing the subject of the CT. In other examples, the object of interest may be referred to by application or context specific terms. For example, in medical CT applications, an object of interest may be a body part or collection of parts such as a particular tooth, set of teeth, finger, hand, particular organ, etc. Or, as another example, in industrial CT applications, the object of interest can refer to a composition, manufactured part, portion of a part, material, or other article of manufacture. Further, the object of interest may be referred to by the name of the part, for example, a jet turbine blade is referenced later in this disclosure. Although the terminology can vary for the object of interest, it should be understood that the term object of interest is intended as a generic term to encompass any physical thing that is or will be the subject of an actual CT scan.

Some embodiments of the present disclosure are concerned with training an artificial intelligence model based on a CAD model representative of an object of interest. While the object of interest may not actually be CT scanned in connection with the training (instead CT scanning may be simulated on the CAD model) the reference point for the CAD model refers to an object of interest that ultimately will be actually CT scanned such that the benefits discussed herein from leveraging the trained artificial intelligence model in correcting reconstruction of an actual CT scan can be realized.

Some aspects of this disclosure involve computer-aided design (CAD) models representative of the object of interest. The term CAD model should be understood to include any representation of the object of interest created by the aid of a computer. The term CAD model is not intended to be limited to CAD model files such as stereolithography (STL) files, STEP files, or any other public or proprietary CAD model file format. Other representations of the object of interest should also be considered CAD models. For example, CAD models should be understood to include digital twins and synthetically generated simulations. An image or other type of representation of the object of interest should also be considered a CAD model in accordance with the present disclosure. For example, high resolution photographs of the object of interest, g-code for additively manufacturing the object of interest, a scanning electron microscopy (SEM) image of the object of interest, a transmission electron microscopy (TEM) image of the object of interest, and CT projections, sometimes referred to as a sinogram, of the object of interest all constitute CAD models representative of the object of interest, are a few examples of CAD models of the object of interest. Further, the CAD model representative of the object of interest need not be derived from the actual object of interest. For example, where the object of interest is a lateral incisor tooth or a jet engine turbine blade, a CAD model of any lateral incisor tooth or any jet engine turbine blade may constitute a CAD model representative of the object of interest so long as the model is sufficiently similar to the object of interest. That is, the CAD model could be derived from a sister object (or representation thereof) that is similar to the object of interest or the CAD model could be crafted from scratch. The amount of similarity for the CAD model to be considered a suitable representation of the object of interest can vary depending on a wide range of factors, such as the available training time, number of overlapping features, and a variety of other factors.

Throughout this disclosure reference is made to defects and artifacts. A defect can refer to essentially any physical imperfection or abnormality. In industrial applications differences between the design of an object and a manufactured version of the object are defects. For example, pores, cracks, inclusions, misruns, cold shuts, flow lines, sink marks, vacuum voids, weld lines, short shots, warping, burn marks, jetting, and flash are a few different examples of different types of manufacturing defects that can arise due to different manufacturing processes (e.g. injection molding, casting, and additive manufacturing). Defects can also arise for other reasons, such as through wear of the object over time. In medical applications, differences between a normal body and abnormal body are considered defects. For example, medical defects can include complex bone fractures and tumors, cuts, scrapes, bruising, incisions, conditions such as cancer, heart disease, emphysema, internal injuries and bleeding, blood clots, excess fluid, infection, or any other physical imperfection or abnormality of the body.

An artifact can refer to essentially any virtual imperfection or abnormality. Artifacts are not naturally present but occur as a result of a preparative or investigative procedure. For example, differences between an object and a reconstructed image that occur because of the CT scan of the object are artifacts. Artifacts can be especially troublesome when they mask defects attempting to be detected by a CT scan. Beam hardening and detector noise are two common sources of artifacts in CT that are discussed throughout this disclosure in connection with various embodiments.

Figure 12A:
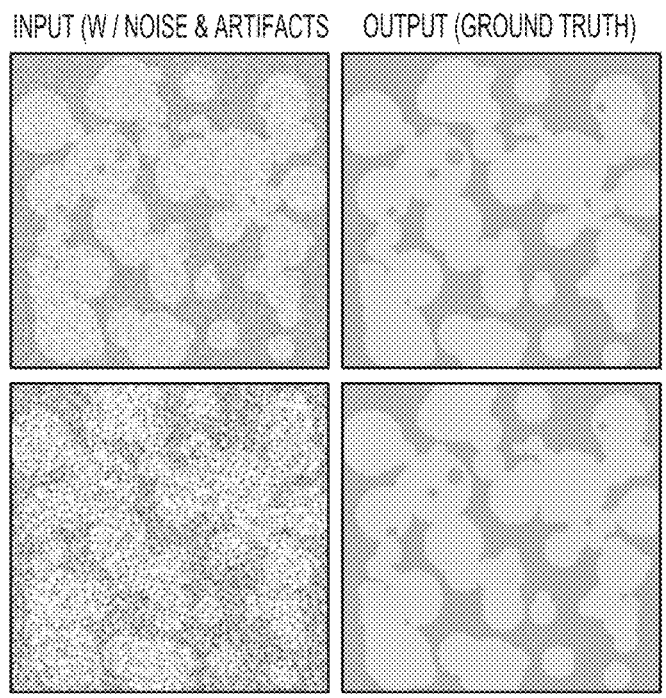
FIG. 12A shows a training pair example of a visualization of simulated data set, which illustrates the present disclosure is not limited to reduction of beam-hardening artifacts.
Figure 12B:
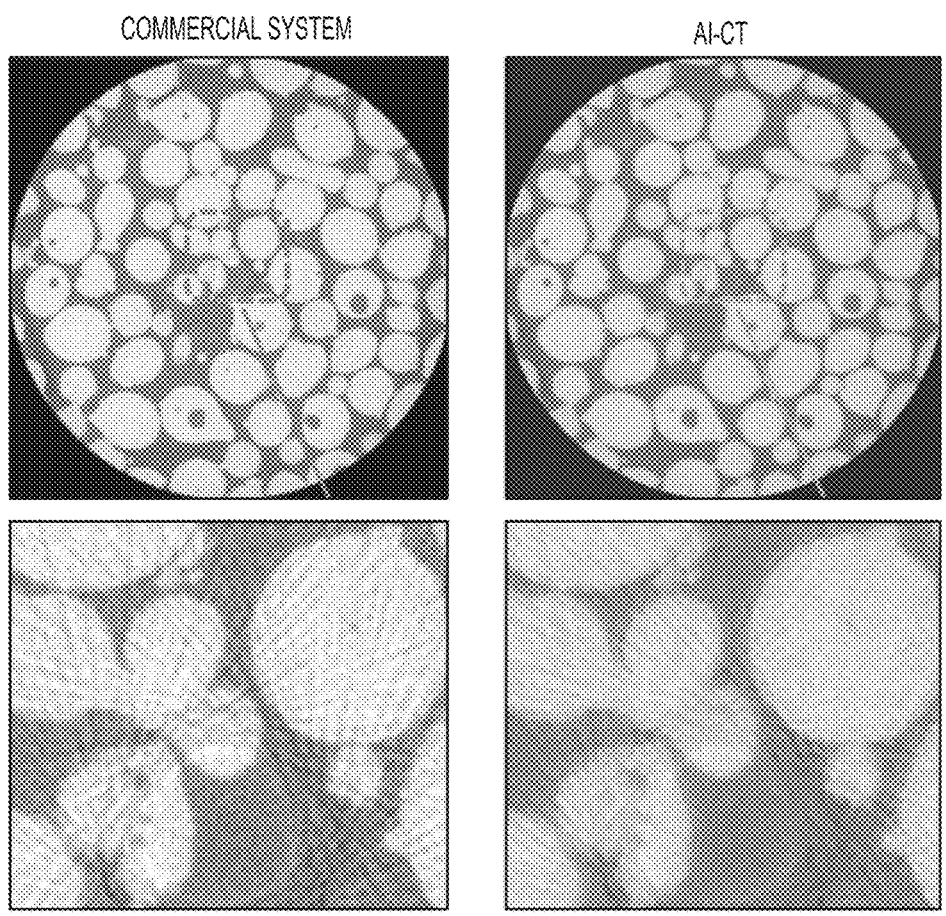
FIG. 12B shows exemplary test results from real data comparing a commercial system and a method of the present disclosure, which illustrates the present disclosure is not limited to reduction of beam-hardening artifacts.
Figure 13:
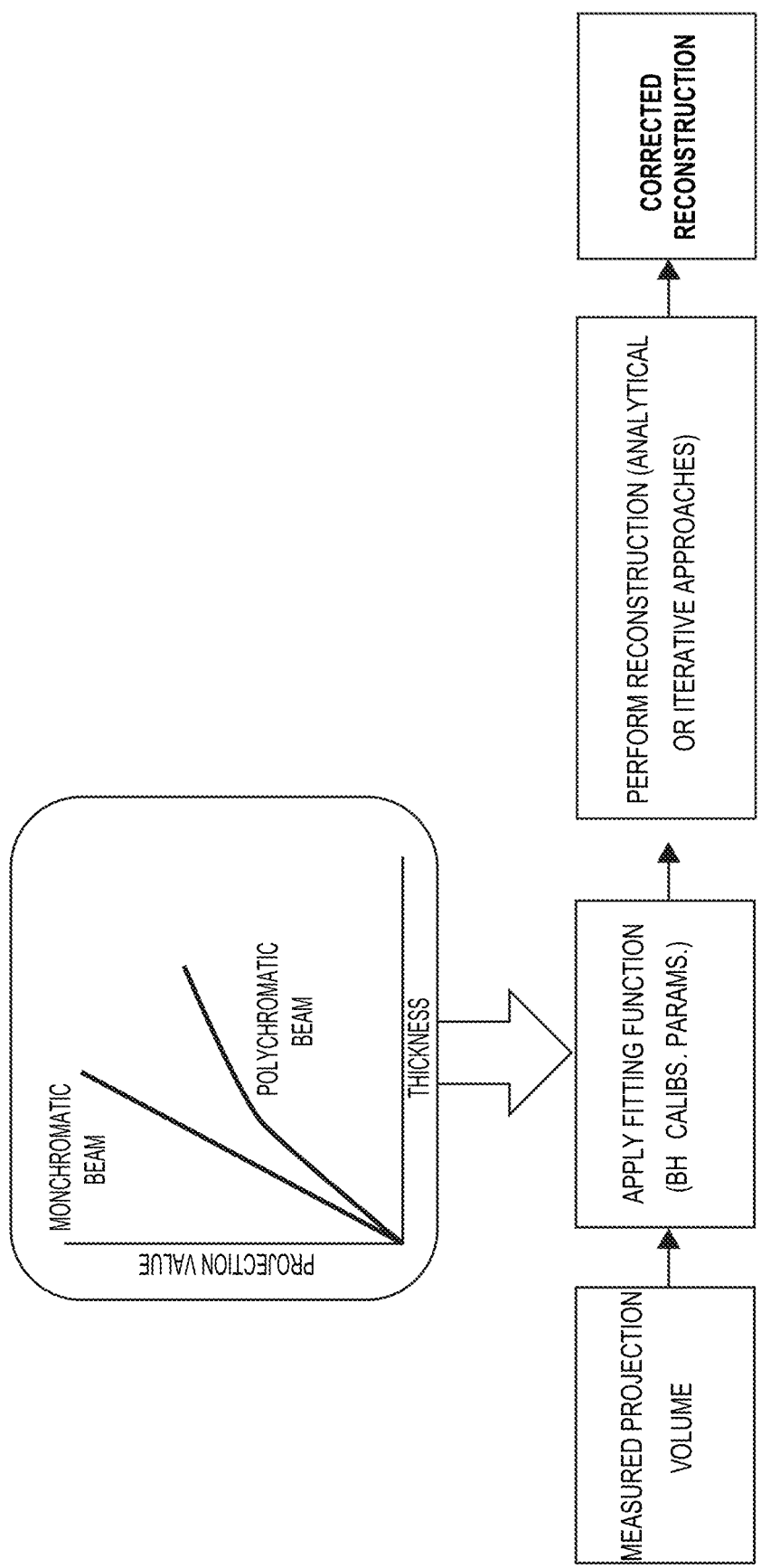
FIG. 13 shows a prior art linearization method.
Figure 14:
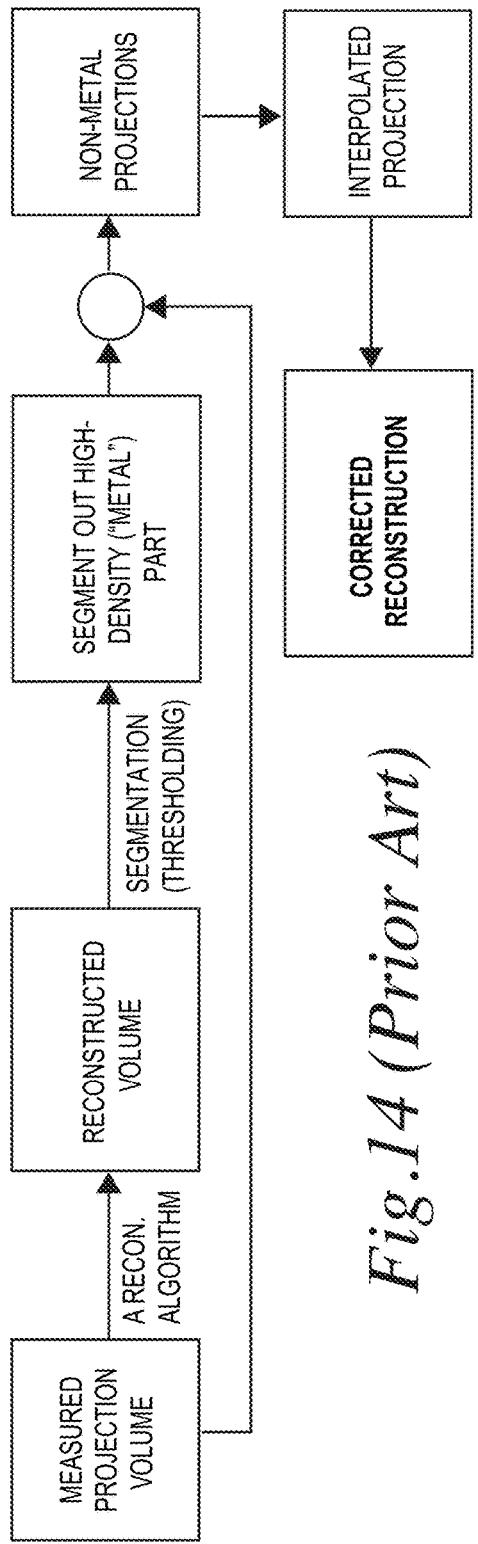
FIG. 14 shows a prior art projection-based metal-artifact reduction algorithm.
Figure 15:
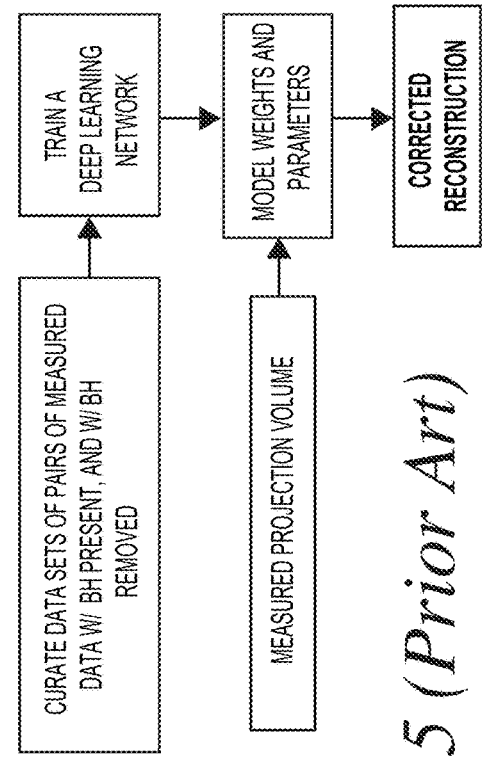
FIG. 15 shows a prior art deep learning-based technique

However, beam hardening and detector noise are not the only two sources of noise that can be reduced with embodiments of the present disclosure. Referring to FIG. 12A, two different training pair examples are illustrated of simulated data. The top left panel of FIG. 12A depicts a CAD model with simulated noise. Noise in computed tomography refers to unwanted changes in pixel values. Noise can arise from different sources. Often noise in CT scans refers to detector noise that arises when the signal level of the source, such as an x-ray beam, compared to the level of background noise is too low. Noise can also arise from electronics interfering with the CT scan equipment, this type of noise can be referred to as electronic noise, electromagnetic noise, or electromagnetic interference. The bottom left panel of FIG. 12A shows simulated representation of the effects of a shorter scan time and how that can introduce artifacts in the reconstruction. The right panels show the simulated starting CAD model, in this case representative of a metal additive manufacturing object. By training the AI-CT to approximate the high quality reconstruction on the right taking the low quality reconstructions as input on the left, the AI-CT can be trained to map input images similar to those on the left such that reconstructions such as those on the right can be generated therefrom. This can enable embodiments where scan time is purposely lowered because the reconstruction can offer significant improvement in image resolution, for example up to 10 times improvement, defect detectability, at reductions of scan time of 5 times or more. FIG. 12 B illustrates test results with real data where there is no ground truth available. The left panels illustrate a reconstruction of a metal additively manufactured object while the right panels illustrate a reconstruction of the same metal additively manufactured object utilizing an embodiment of the present disclosure. The close-up views show how there is greater artifact reduction in the embodiment of the present disclosure than in the commercial system shown on the left.

The term ground truth is also utilized in the disclosure. This refers to an accurate, or more accurate, representation. Often ground truth is provided by direct observation, such as empirical evidence, as opposed to information provided by inference. Testing a CT reconstruction can involve comparison of a reconstructed image to the ground truth in order to assess the accuracy of the reconstruction. The ground truth can be obtained in a variety of different ways. It may be obtained by utilizing a more reliable source, such as a high resolution image capture or, in the case of simulation, the ground truth may be directly available as a "before" simulation representation.

Figure 1C:
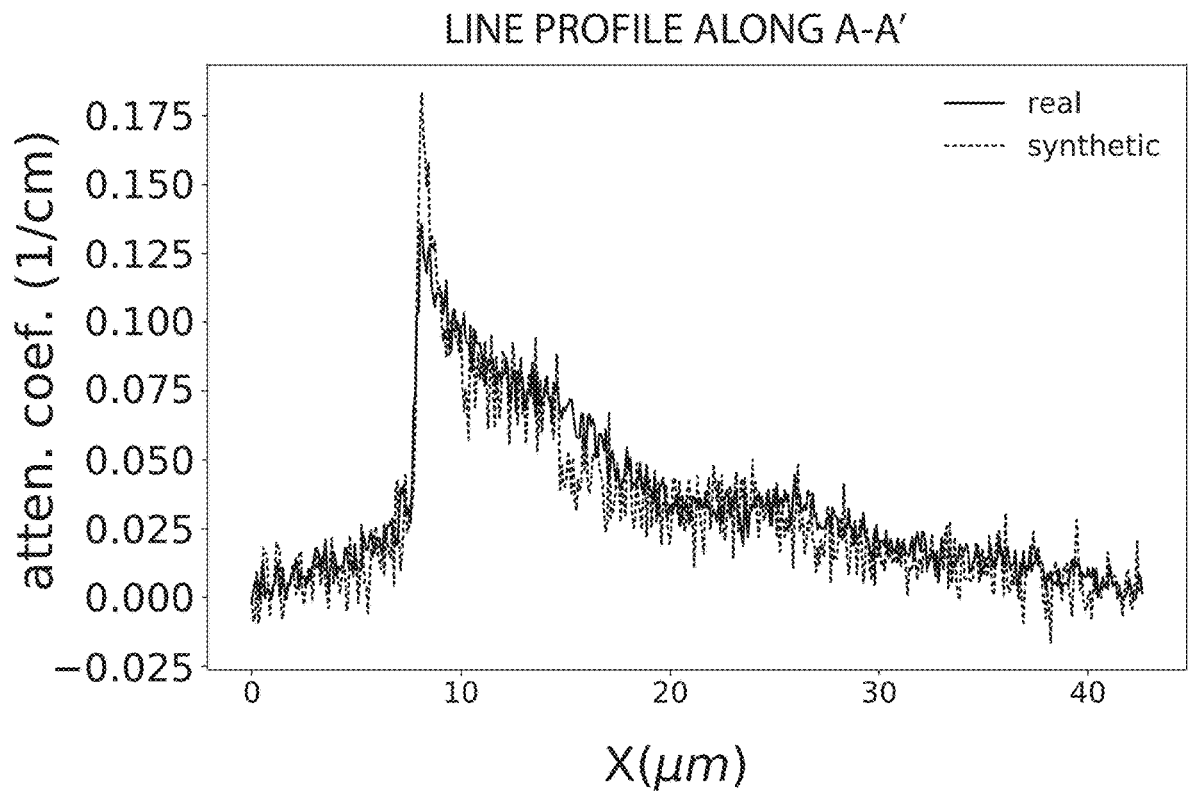
FIG. 1C shows a line-profile along central horizontal (A-A').

FIGS. 1A and 1B show a cross section from the reconstruction of a jet engine turbine blade reconstructed using a standard reconstruction algorithm without accounting for beam hardening. The streaks and cupping artifacts (shown with labeled arrows) in the images can confound further analysis of the image to detect defects. Due to the cupping artifact, the reconstructed attenuation coefficient values of the part are non-uniform despite the fact the scanned jet engine turbine blade is constructed from a homogeneous material. The reconstructed image is brighter at the edges (increased gray-level values), and darker within the central region of the part (lower gray-level values). FIG. 1A depicts a reconstructed image from real x-ray computed tomography projection measurements acquired by an XCT scanner, in this case the ZEISS METROTOM x-ray CT scanner. FIG. 1B depicts a reconstructed image from simulated XCT projections acquired by a virtual application of an XCT scanning procedure to a CAD model of the jet engine turbine blade. FIG. 1C depicts a line-profile comparing the real and synthetic (or simulated) attenuation coefficient at different distances along central horizontal (A-A') of both FIGS. 1A and 1B at the same position.

Figure 2:
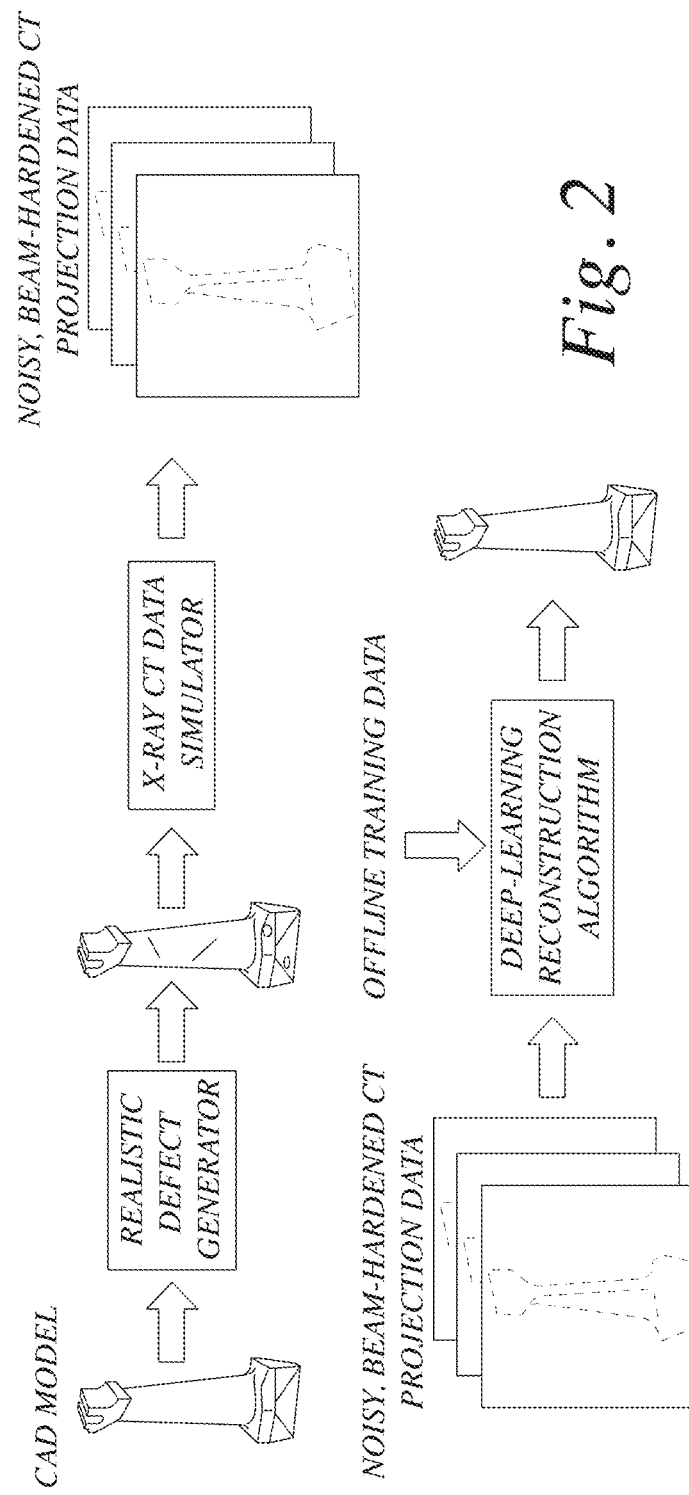
FIG. 2 illustrates a representative flow diagram of one embodiment of the present disclosure.

One aspect of the present disclosure to address the challenge of beam hardening artifacts in CT is illustrated in FIG. 2. The system and method includes obtaining a CAD model of parts to be scanned, simulating realistic CT data, and using this data, along with a deep neural network (DNN) to reconstruct the part accurately. Once such a deep-learning model has been suitably trained, it can be deployed on unknown data sets corresponding to the CAD models (i.e., CT scans of objects of interest) in order to obtain high-fidelity reconstructions with artifact reduction. In this case, because the deep learning neural network was trained on detector noise and beam-hardening, the artifact reduction those are the artifacts that will be reduced. In alternative embodiments, where the DNN is trained on additional or different artifacts, reductions can be realized with respect to those different artifacts.

In essence, FIG. 2 provides a high-level exemplary solution for dealing with data sets impacted by beam hardening. The solution can be implemented in one or more computer components. The method uses a CAD model, introduces realistic defects to the model, and uses the modified model to simulate one or more realistic CT data sets. A deep learning reconstruction algorithm or model can be designed or trained to accurately reconstruct the original 3D volume from such data. Once such a network has been trained, it can be applied or deployed to the experimental data for the part being scanned.

One aspect of the present disclosure is generally directed to a realistic defect generator. The realistic defect generator can accept an available CAD model as depicted in FIG. 2, or be configured to utilize artificial intelligence to provide a higher quality CAD model with simulated defects. In one embodiment, the realistic defect generator is configured to train a deep generative model (separate from the deep learning artifact reduction model) based on a CAD model and one or more training representations derived from physically manufactured versions of the object of interest. The training representations are generally higher resolution representations that include data regarding features that are not represented in the CAD model or represented at a lower quality in the CAD model. The training representations generally include representations of physical defects of the object of interest. Further, the realistic defect generator is configured to train (or receive a pre-trained) deep generative model with realistic defect model parameters that add realistic defects to representations of the CAD model. In some embodiments, the training representation can include one or more high-resolution CT images of the object of interest, a high-resolution scanning electron microscopy image of the object of interest, or a high-resolution transmission electron microscopy image of the object of interest. The generative deep network can be utilized not only to aid in integrating details about the object of interest into the CAD model, but can include a resolution enhancing component configured to train a deep generative model based on the CAD model and one or more training representations derived from physically manufactured versions of the object of interest where the training representations are higher resolution than the CAD model and the resolution enhancing component is configured to generate a trained deep generative model with enhanced resolution model parameters that increase resolution of features of the CAD model or the CAD model as a whole.

Figure 17:
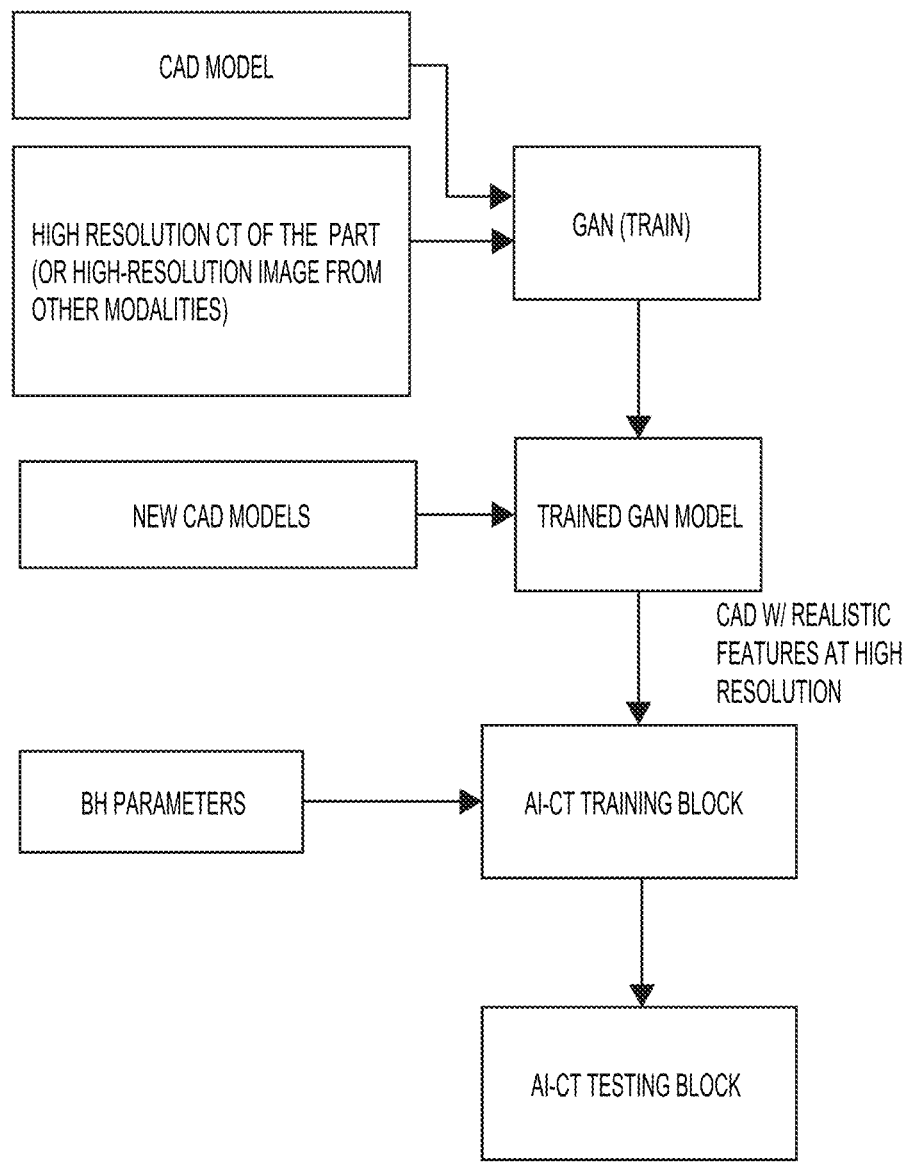
FIG. 17 shows one embodiment of the present disclosure leveraging deep generative networks.

FIG. 17 illustrates one embodiment of a generative neural network being used to provide an improved CAD model to an AI-CT training block. Specifically, in this embodiment, a generative adversarial network (GAN) is utilized to create CAD models with realistic defects, to be used in concert with a deep learning system and method for reducing beam hardening or other artifacts caused by CT imaging systems.

In general, a GAN is a neural network that generates synthetic data given certain input data. In this embodiment, a GAN is being utilized to generate a version of the CAD model of the object of interest that incorporates simulated defects. The simulated defects are derived from images or other information provided to the GAN. General adversarial networks typically utilize two models, a generative model and a discriminative model. The discriminative model operates like a normal classifier that classifies images into different categories, for example it can be configured to determine whether an image is real or artificially generated, that is simulated or synthetic. While the discriminative model tries to predict given a certain set of features, the generative model is configured to make predictions about features given classes. In a GAN, a generator generates new instances of an object with the discriminator and determines whether the new instance belongs to the desired dataset. In the current embodiment, the GAN is provided with a library of CAD models that represent an object of interest without any defects along with high quality images of various versions of the object of interest that do include actual defects similar to the type of defects that can be expected at the input once the model is deployed. One goal of the GAN is to produce CAD models that are better suited for use with the DNN of the present disclosure; that is, CAD models with realistic defects. Doing so will mean that the trained AI, the DNN not the GAN, will be more likely to be able to discern and reduce artifacts created due to CT scanning as opposed to artifacts that are present for other reasons, such as because the object actually has a defect, such as a crack, pore, or inclusion. Returning to the GAN, during the training process, parameters such as weights and biases can be adjusted through backpropagation (much like in a DNN) until the discriminator learns to distinguish the given CAD model without simulated defects from synthetic CAD models with simulated defects. The generator is provided feedback from the discriminator and uses it to produce images that are more similar to the target, in this case a synthetic CAD model with simulated defects. The discriminator network can be a convolutional neural network that classifies the CAD models as either fake or real and the generator can produce new CAD models through a de-convolutional network. With GAN technology being new, there are many different varieties and variations being utilized, while a detailed discussion of these various AI systems is outside the scope of this disclosure, it should be understood that essentially any type of GAN can be adapted for use in connection with embodiments of this disclosure in order to improve CAD models with simulated defects. For example, deep convolutional GANs, conditional GANs, super resolution GANs, InfoGANs, CycleGANs, and Wasserstein GANs, to name a few types of GANs that can be adapted for use with the present disclosure. Further, in other embodiments, other types of generative neural networks that are not adversarial can be trained and employed to improve the quality of the CAD model.

Some embodiments of systems and methods of the present disclosure, and specifically the embodiment disclosed in FIG. 17, train and deploy a GAN or other deep learning network for CAD models along with examples of high resolution CTs, or other higher resolution modalities such as SEM/TEM to include more realistic representation of fine features such as cracks, inclusions, and pores. In turn, this allows the deep learning neural network of the AI-CT training block to be trained with more realistic CAD models. Ultimately, when the deep learning model is used in connection with real data, up to an order of magnitude in improvement can be realized.

Figure 3:
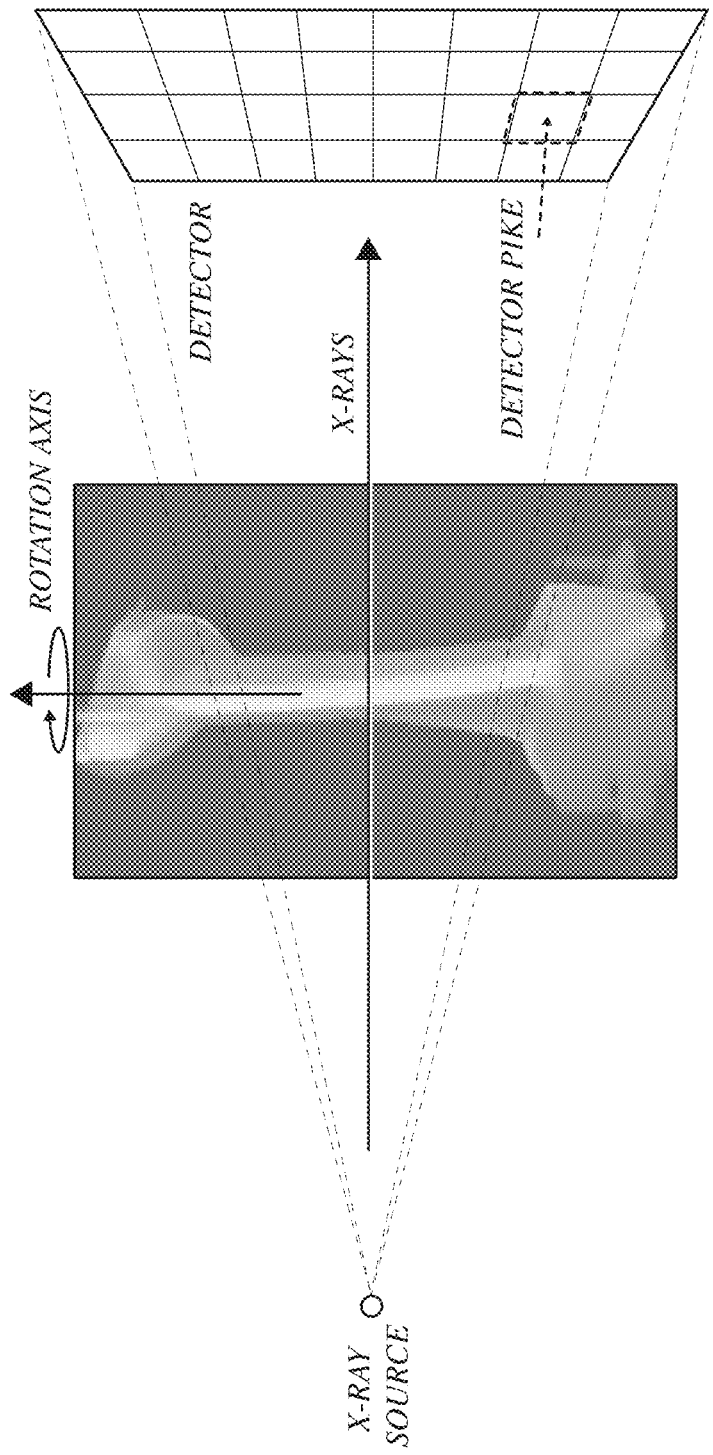
FIG. 3 illustrates a schematic of a cone beam CT system with a turbine blade as the object of interest.

FIG. 3 shows a schematic of a cone-beam CT (CBCT) system typically used in industrial CT systems and suitable for use with some embodiments of the present disclosure. An x-ray source (typically polychromatic) is used to illuminate the object of interest, and a corresponding transmission radiograph/image is obtained by a flat panel detector. To perform CT, the object is rotated about a single axis of rotation, and at each position, a projection image is measured. These measurements are typically normalized by a reference scan and then processed by an algorithm to obtain a 3D reconstruction. Although the illustrated embodiments of the present disclosure are described in connection with x-ray computed tomography (XCT), where the source is an x-ray beam, the systems and methods of the present disclosure are also suitable for use with other forms of computed tomography. For example, the systems and methods of the present disclosure can be used in connection with neutron computed tomography systems, or essentially any other type of computed tomography system.

The most commonly used algorithm in commercial XCT scanners is the Feldkamp-Davis-Kress (FDK) method, which can analytically invert the measurements. One advantage of the FDK algorithm is that it is very fast, since it is based on an analytic expression that can be rapidly computed. However, the FDK method works best when a large number of projection images are measured, and they provide a sufficiently high signal-to-noise ratio. FIG. 3 specifically shows a schematic of the cone beam XCT system with a turbine blade as the object of interest. It shows how the x-ray source is used to illuminate an object of interest, and the detector is used to measure the transmitted signal. The object is rotated, and several such measurements are made and processed by a tomographic reconstruction algorithm to produce a 3D reconstruction.

Another class of methods that has been widely researched for CT reconstruction are model-based image reconstruction (MBIR) approaches. These MBIR algorithms work by formulating the tomographic reconstruction by minimizing a cost function that balances a data-fitting term. This term incorporates a physics-based model for the imaging system and noise characteristics of the detector, and a regularization term that incorporates a model for the underlying 3D object itself (such as local smoothness). MBIR techniques have enabled dramatic advances in several CT applications, including ultra-low-dose medical CT, in which they have enabled high-quality reconstructions from sparse and extremely noisy data. However, the use of MBIR for industrial CBCT is still in its infancy because of the high computational demands dictated by the high-resolution detectors used in these applications. Furthermore, irrespective of the algorithm used, the aforementioned methods can result in reconstructions with significant artifacts if the underlying assumptions of the models used are violated, as is the case with beam hardening.

For a monochromatic source of x-rays at energy $E_0$, a common expression for the normalized measured signal is based on Beer-Lambert's law and is given by $$-\log\left(\frac{I}{I_0}\right) = \mu_{E_0} d, \quad (1)$$

where I is the attenuated intensity, $I_0$ is the reference intensity with no object in between, $\mu_{E_0}$ is the attenuation coefficient at energy $E_0$, and d is the thickness of the material. In the case of a polychromatic source, I and $I_0$ are related to the source spectrum (f(E)) and detector efficiency ($\gamma$(E)) through $$I = \int e^{-\mu(E)d} f(E)\gamma(E) dE \quad (2)$$

$$I_0 = \int f(E)\gamma(E) dE. \quad (3)$$

Therefore, for a polychromatic light source, the linear relation between the normalized measurement and thickness (d) shown in Eq. (1) no longer holds. Although the expression in Eq. (2) is the most general form for x-ray transmission through a sample, using it for simulations requires knowledge of the source spectrum, the material attenuation coefficient as a function of energy, and the detector efficiency as a function of energy. Van de Casteele et al. present a simplified bi-modal energy model that can accurately model the beam propagation using two dominant energies in the x-ray source beam. In such cases, and assuming the two dominant energies to be $E_1$ and $E_2$, one can write $$-\log\left(\frac{I}{I_0}\right) = \mu(E_2)d + \log\left(\frac{1+\alpha}{1+\alpha e^{-(\mu(E_1)-\mu(E_2))d}}\right) \quad (4)$$

$$\alpha = \frac{f(E_1)\gamma(E_1)}{f(E_2)\gamma(E_2)}. \quad (5)$$

At the limit for small thicknesses (d→0), Eq. (4) reduces to $$-\log\left(\frac{I}{I_0}\right) = \left(\frac{\alpha}{1+\alpha}\mu(E_1) + \frac{1}{1+\alpha}\mu(E_2)\right)d \equiv \mu_{eff} d, \quad (6)$$

which is same as Beer's law with an effective attenuation coefficient $\mu_{eff}$. The expression $\mu_{eff}$ is assumed to be the attenuation coefficient of the material if the x-ray source were monochromatic and therefore no beam hardening would have occurred. These parameters can be utilized to model beam hardening and to generate synthetic data for embodiments of this disclosure. In alternative embodiments for reducing other artifacts caused by different sources, parameters associated with those artifacts can be utilized to model that artifact and generate synthetic data to train the DNN. For example, in embodiments of the present disclosure that relate to neutron computed tomography, or other forms of computed tomography, parameters associated with the types of artifacts caused in those forms of computed tomography can be used to model those artifacts and generate synthetic data to train the DNN. For example, Beer-Lambert's law is applicable for neutron CT and FDK, or other techniques such as filtered back propagation, can be utilized for simulating reconstruction of neutron CT projections.

Figures 4A, 4B, 4C:
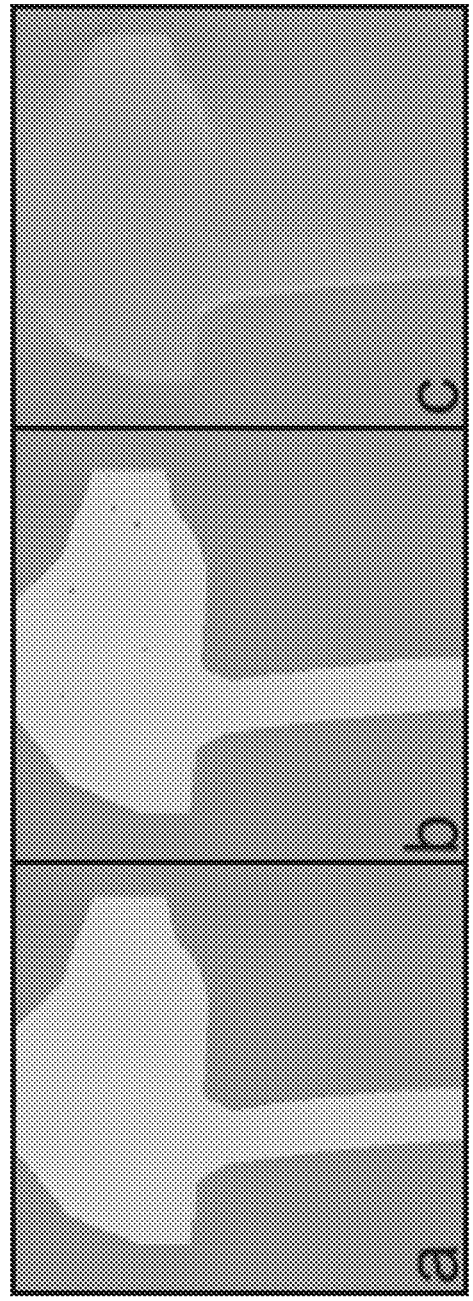
FIG. 4A illustrates a cross section from a CAD model of an object of interest.
FIG. 4B illustrates a cross section from a CAD model with simulated defects.
FIG. 4C illustrates a cross section from a reconstructed CAD model with simulated beam hardening and detector noise included in the simulations.

To simulate CT reconstruction from beam hardened measurements, CAD models of a part to be scanned using CT once it has been manufactured can be input into the system or otherwise saved in memory for processing by the system. One exemplary process for creating a synthetic or simulated data set is set forth below. In connection with the description of this process we refer to FIG. 4, which illustrates three images associated with an embodiment of the present disclosure for creating realistic objects from a CAD model, simulating CT data, and reconstructing the object using conventional algorithms that do not account for beam hardening. Cross section are shown of the process at various stages in FIGS. 4A-C. FIG. 4A illustrates a cross-section of the original CAD model, FIG. 4B illustrates a cross-section of the CAD model with simulated defects incorporated therein, and FIG. 4C illustrates an example cross-section of a reconstructed CAD model (or image) with beam hardening and noise included in the simulation.

1. Estimate $E_1$, $E_2$, and $\alpha$ for the system and sample to be scanned. This procedure is outlined at the end of this list.
2. Voxelize the CAD model corresponding to the sample to be scanned and interpolated it to the desirable resolution. An example cross section of half a turbine blade is shown in FIG. 4A.
3. Generate volumes with defects of different shapes and sizes. In the depicted embodiment, cracks and holes/pores were the main defects simulated. For crack propagation in 2D layers, polynomials were assumed with fractional exponents that are randomly chosen between 0.7 and 1.2 at different locations throughout the 3D volume. The pores/holes were selected to be between 1 and 9 pixels in diameter, randomly distributed along the volume. In alternative embodiments the defects could be simulated according to different parameters. Further, additional or different defects can be simulated.
4. A logical AND operation between the CAD model and the defect volume is performed, as shown in FIG. 4B. Some or all of the volumes can be blurred or otherwise filtered. For example, in the depicted embodiment about half of the volumes were blurred with a Gaussian filter, including the volume depicted in FIG. 4B, to reduce the sharpness of the defects, fade the smaller defects, and increase the realism of the model with its simulated defects.
5. Next, the CAD model enhanced with the simulated defects is subjected to simulation of a typical CT scan with parameters relevant to the system. The simulated projection data for the blades can be calculated and processed by the system. In this simulation, the ASTRA toolbox, a MATLAB and Python toolbox of high-performance GPU primitives for 2D and 3D tomography, was used for forward projection, modified to account for beam hardening using Eq. (4), and simulated Poisson statistics for the measurement.
6. The volume was reconstructed using the FDK algorithm from the ASTRA toolbox. A cross section of the reconstructed volume is shown in FIG. 4C and clearly shows beam hardening artifacts such as cupping and streaks.

Realistic-looking synthetic data can be obtained in a variety of different ways. In one embodiment, experimental projection data from a 3D printed part (Inconel738 material in this case) can be obtained and $E_1$, $E_2$, and a fitted so that the reconstructions obtained from the simulated data match or are sufficiently similar to the reconstruction obtained from the real CT measurement of the turbine blade. FIGS. 1A-B show a comparison of cross sections of the reconstruction along the airfoil region created from synthetic (FIG. 1B) and from experimental (FIG. 1A) data.

Figure 5:
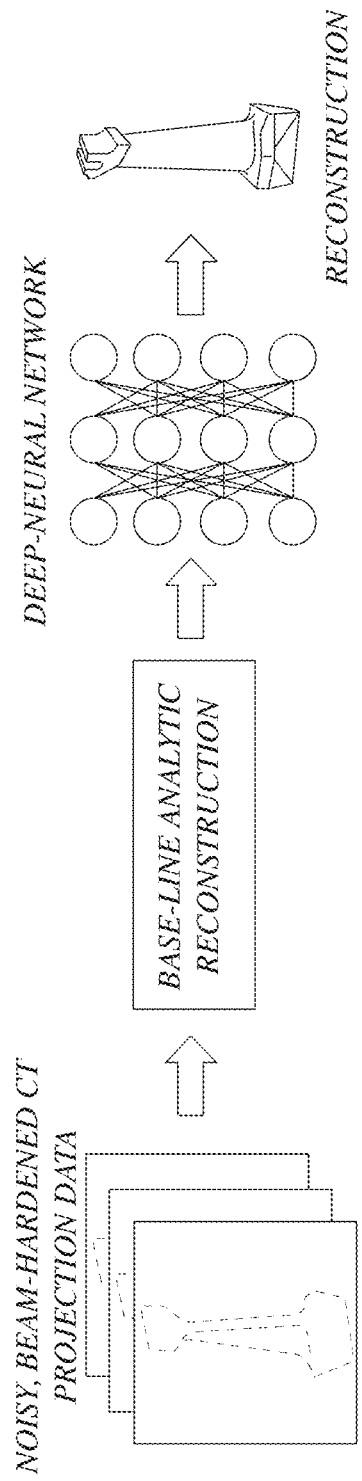
FIG. 5 illustrates a schematic representation of one embodiment of a deep neural network architecture that implements the method illustrated in the flowchart of FIG. 18.

One goal of beam hardening correction algorithms is to suppress, remove, or reduce artifacts in the 3D CT reconstruction. In additive manufacturing applications this allows one to accurately characterize the parts; develop statistical models that can find the correlation between printing parameter, scan path, and so on with the characterization results; and then use that information to improve the quality and consistency of the parts being built. Embodiments of a deep learning-based system and method to suppress noise and beam hardening artifacts in the reconstructed volumes is provided. One embodiment of this approach is shown in FIG. 5, which illustrates exemplary deep neural network architecture used in embodiments of this disclosure. Data is inverted using a standard algorithm, followed by use of a deep-neural network to remove artifacts due to noise, sparse sampling, and beam hardening. In particular, in the depicted embodiment, the initial reconstruction is performed with the FDK algorithm, followed by using a DNN to correct for the artifacts present in the 3D volume. The DNN suppresses artifacts in the 3D volume based on parameters learned from an offline training stage. There are a number of options from which to choose a DNN. This disclosure discusses two different architectures—AI-CT, and MSD-Net, which have been used to remove conventional noise from CT reconstructions.

Figure 6:
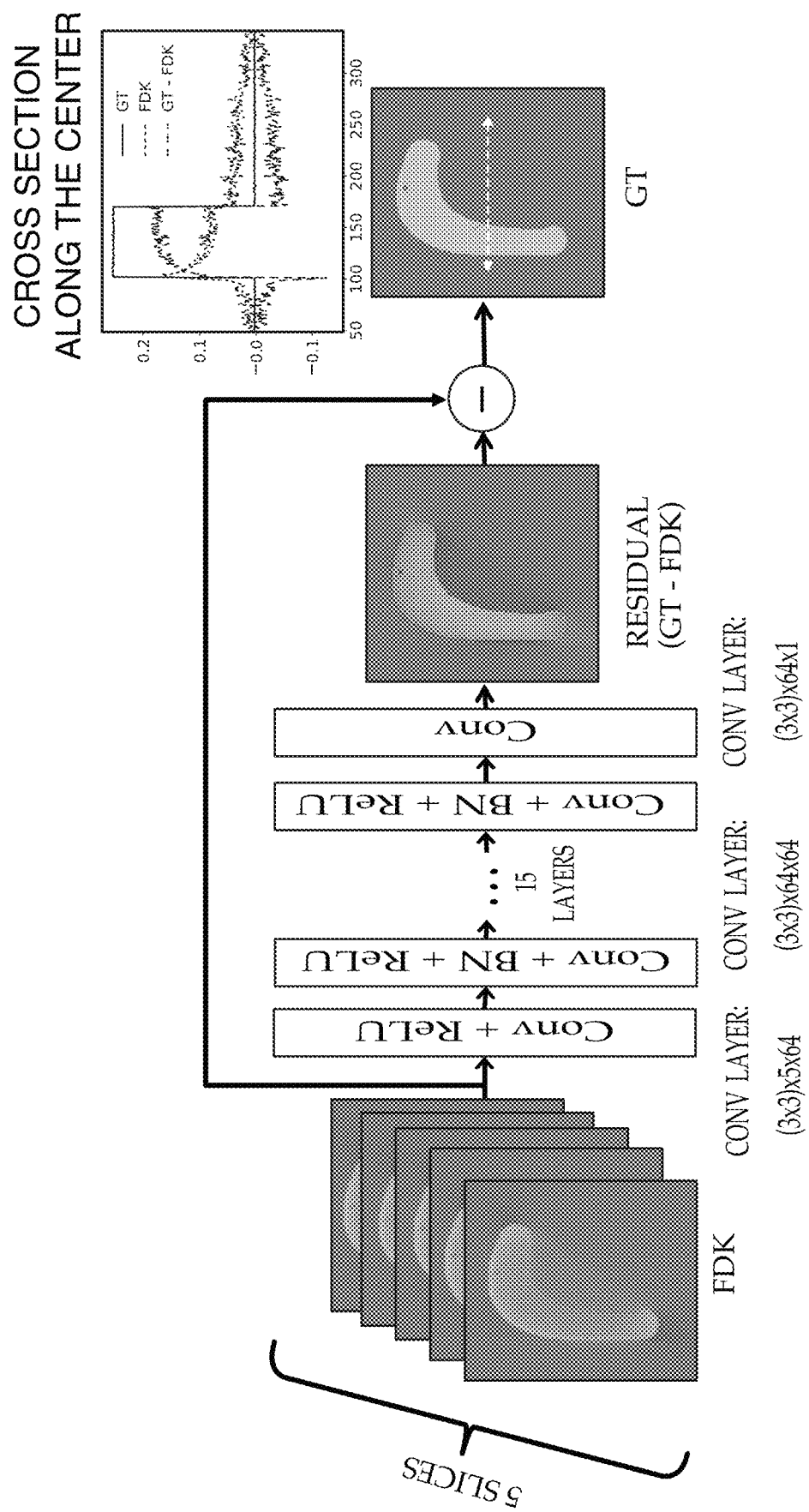
FIG. 6 illustrates a schematic of a deep residual neural network architecture.

The training process for the exemplary deep residual neural network architecture (AI-CT) will now be discussed in detail with reference to FIG. 6. In essence, the network learns to predict the residual artifacts (caused by beam hardening, detector noise, and sparse sampling) from a low-quality input reconstruction, which can be subtracted from the input to approximate a reconstruction close to the high-quality ground truth.

1. The schematic of AI-CT is shown in FIG. 6. It includes 17 convolutional layers with the transformation kernel of the form $(3\times3)\times N_{in}\times N_{out}$. Here, $(3\times3)$ represents the convolution filter size applied with $N_{in}$ input $N_{out}$ output channels. Batch normalization (BN) and rectified linear unit (ReLU) functions were applied in the middle 15 layers.
2. The exemplary mixed-scale dense network (MSD-Net) is comprised of an 80 layers mixed-scale dense neural network, with 8 levels of dilation in the filters. The filters were chosen to be of size 3×3 and a batch size of 1 was utilized for training the neural network.
3. The input pairs used in training the networks were the 3D volume of the FDK image reconstruction of the same blade with beam hardening artifacts and detector noise artifacts, and the ground-truth volume with the effective attenuation coefficient and with a small additive Gaussian noise. Adding a small amount of noise to the "perfect" CAD models can assist in improving performance of the network on experimental data sets (generalization). For AI-CT, the network was trained on pairs of noisy input and the residual output, i.e., the difference between the expected output and the input. For MSD-Net, the network was trained on pairs of noisy input and the CAD-based ground truth.
4. The AI-CT network can be trained on patches of data from the input volumes. For example, input patches of size n×n×5, where n was chosen to be 256 were utilized in the current embodiment. The number of neighboring slices was chosen to be five. This configuration allows the network to capture the 3D information in a 2.5D fashion, which in turn increases the accuracy without adding computational burden. A batch size of 16 was utilized for training the neural network. For MSD-Net, also, the number of adjacent slices was set to 5. In contrast to the AI-CT network, MSD-Net was trained on the entire image instead of chunking it into patches. And, a batch size of 1 was used for training the neural network.

5. A mean-squared error criterion can be used to train the neural networks. For both networks, an ADAM optimizer minimized the loss function with $\alpha=0.001$, $\beta_1=:9$ and $\beta_2=0.999$. In AI-CT, the learning rate reduces by a factor of 2× every 70 epochs, or if the validation loss increases for three consecutive epochs, whichever happens first.
6. The proposed networks can be trained on multiple volumes of CT reconstructions. The current embodiments were trained on six volumes of CT reconstructions. These volumes were from three blades with different artifacts and different noise levels, different blurring, but the same beam hardening parameters. For the AI-CT method, the input volumes were divided into patches of data to avoid memory problems and to enable the use of more input data. A patch size of 256×256 was used with a stride of 128; thus, each slice (image from the 3D volume) of 768×768 was divided into 25×256×256 patches (sub-images). In addition, patches with too many background voxels were removed (patches with average values smaller than the mean of the total volume) to improve training. Effectively, half of the volumes were used to create the training/validation data. About 80% of those total patches were used for training and 20% for validation.
7. The same data was used to train the MSD-Net. A similar 80%/20% fraction of data was used for training and validation, but the data did not have to be patched, as the network operated on the entire image.

Figure 7A:
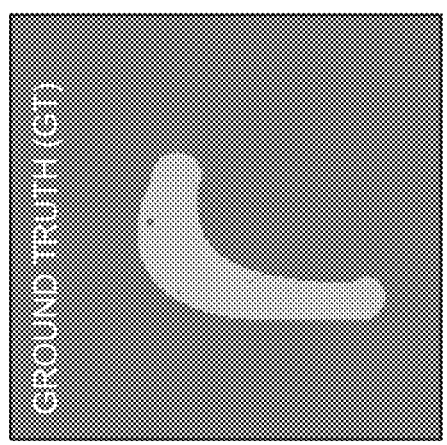
FIGS. 7A-G illustrate a linearization technique to remove beam hardening artifacts followed by the use of well-known algorithms (FDK and MBIR).
Figure 7B:
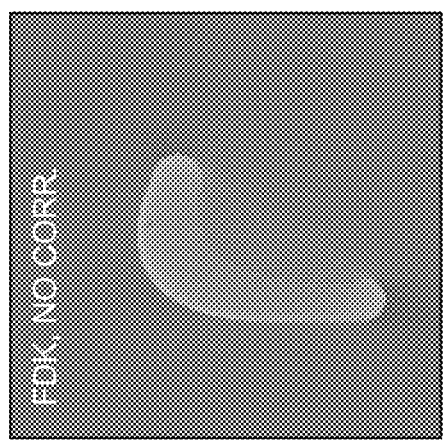
Figure 7C:
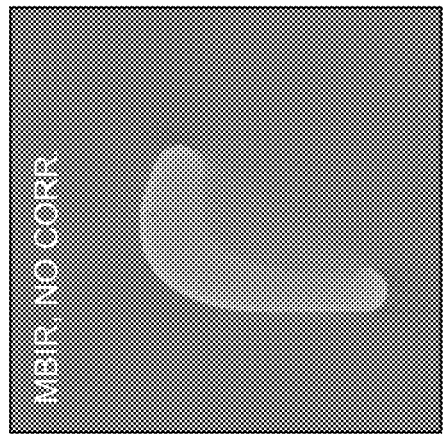
Figure 7D:
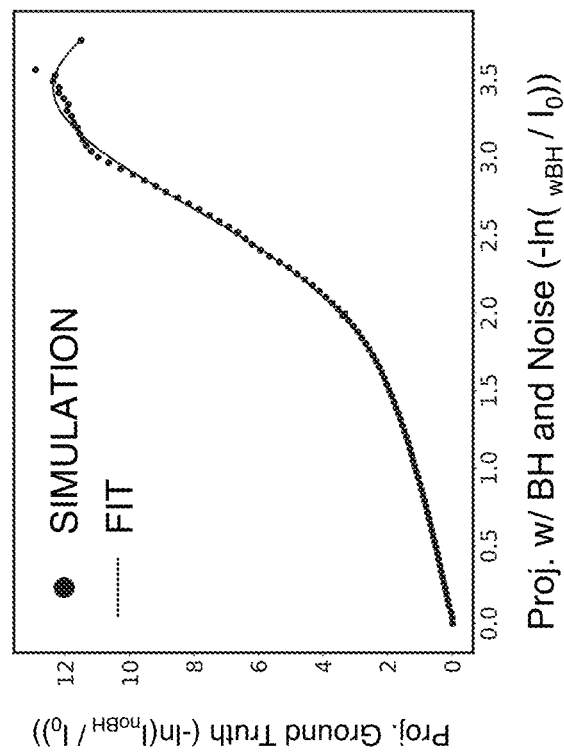
Figure 7E:
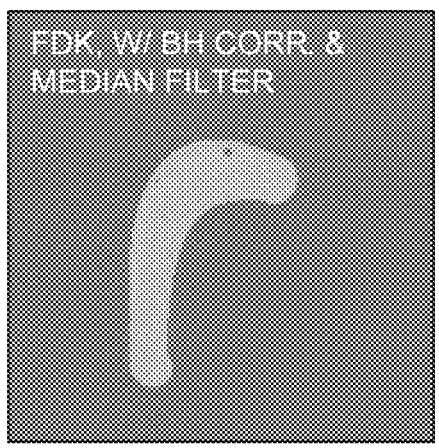
Figure 7F:
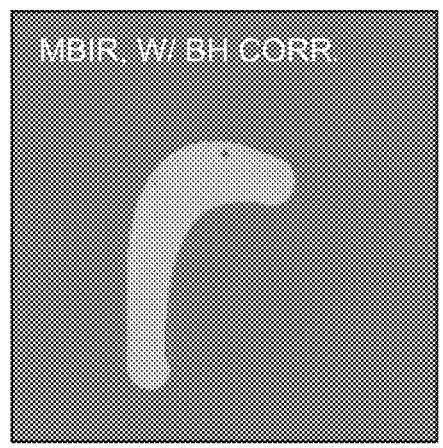
Figure 7G:
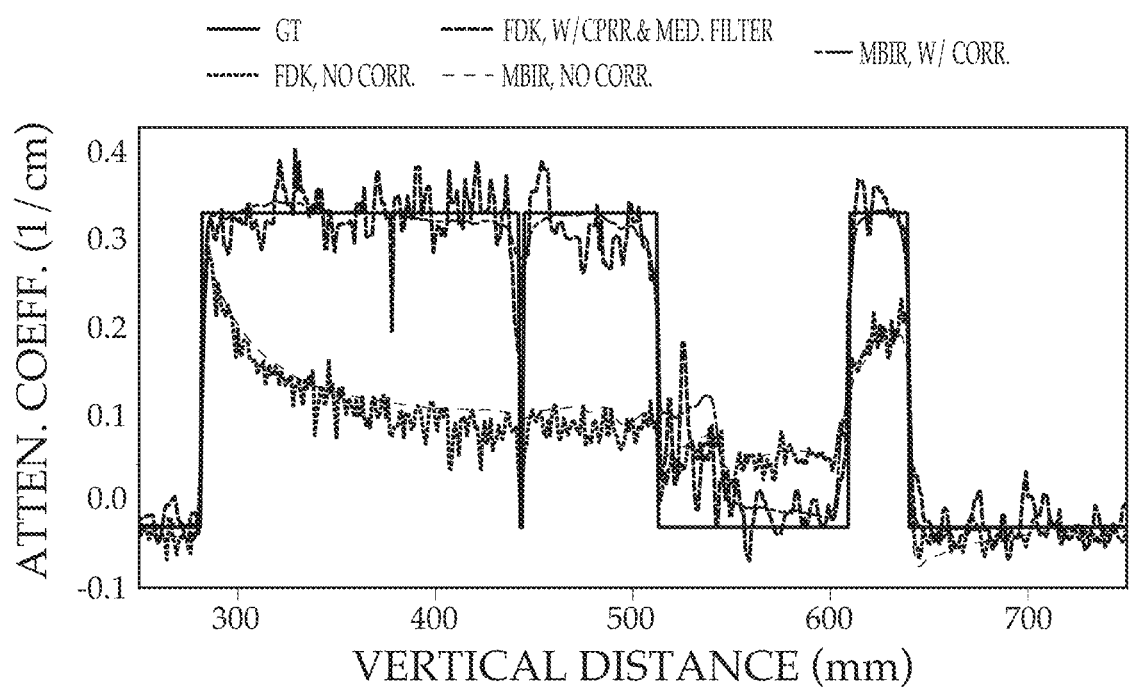

Some results obtained using standard techniques such as FDK and MBIR to perform the reconstruction will be discussed to provide some additional context. One caveat regarding those techniques is that a calibration sample is needed to account for beam hardening and to correct the projection data before performing reconstruction. One linearization approach finds a polynomial that maps the beam hardened projection to the projection without beam hardening—effectively linearizing the relationship between normalized measurement and sample thickness. Instead, we simulated the CT system with a CAD model as object, obtained the projection data affected by beam hardening artifacts and noise ($Proj_{wBH}$), and obtained the projection data unaffected by beam hardening ($Proj_{NoBH}$) using the effective attenuation coefficient from Eq. (6). Next, we found the polynomial fit that mapped the projection values from $Proj_{wBH}$ to $Proj_{NoBH}$ (see FIG. 7D).

FIGS. 7A-G illustrate one linearization technique to remove beam hardening artifacts followed by the use of well-known algorithms (FDK and MBIR). Using CAD model simulations allowed a polynomial fit to be found for linearization of projection data and in turn to perform beam hardening correction in the projection domain.

The interval was divided between minimum and maximum projection values in the $Proj_{wBH}$ into a hundred equal parts. All the pixels that matched these values were found to the fourth decimal point, and then the projection values for those voxels in $Proj_{NoBH}$ were obtained. The mean of the projection values in $Proj_{NoBH}$ at those voxels is plotted against the values in $Proj_{wBH}$ in FIG. 7D. A Cp analysis is carried out for the zero to $11^{th}$ order fits of the data and it was found that an 8th-order fit was suitable for this data. The polynomial fit was then applied to each pixel in the $Proj_{wBH}$ data to create the corresponding corrected projection data. FDK and MBIR were used to perform the reconstruction of data with and without beam hardening correction. A slice from the reconstructed volume is shown for each method in FIGS. 7B, 7C, 7E, and 7F and is compared with the ground truth in FIG. 7A. As expected, both FDK and MBIR produced accurate reconstructions with this linearization scheme to remove beam hardening. The MBIR technique was more effective in suppressing noise while preserving details in the reconstruction. This result is essentially the best FDK and MBIR can offer with respect to beam hardening because the ground-truth volume is being used with no beam hardening to perform linearization. The following section discusses the use of FDK with no correction (to show the impact of beam hardening) and MBIR with a corrected projection for comparison with deep learning techniques.

AI-CT and MSD-Net can be utilized with volumes of CT data with different defect sizes and noise levels from those in the training. Further, different defect generation can be utilized. For example, erosion morphological operations can be applied to produce smaller defects, which can be used for training, or can be used to verify that the network works on data other than which it was trained. This approach was used to evaluate the network's capabilities to reconstruct those defects. For testing in AI-CT, full image slices were used as input to avoid artifacts due to patching.

Figure 8:
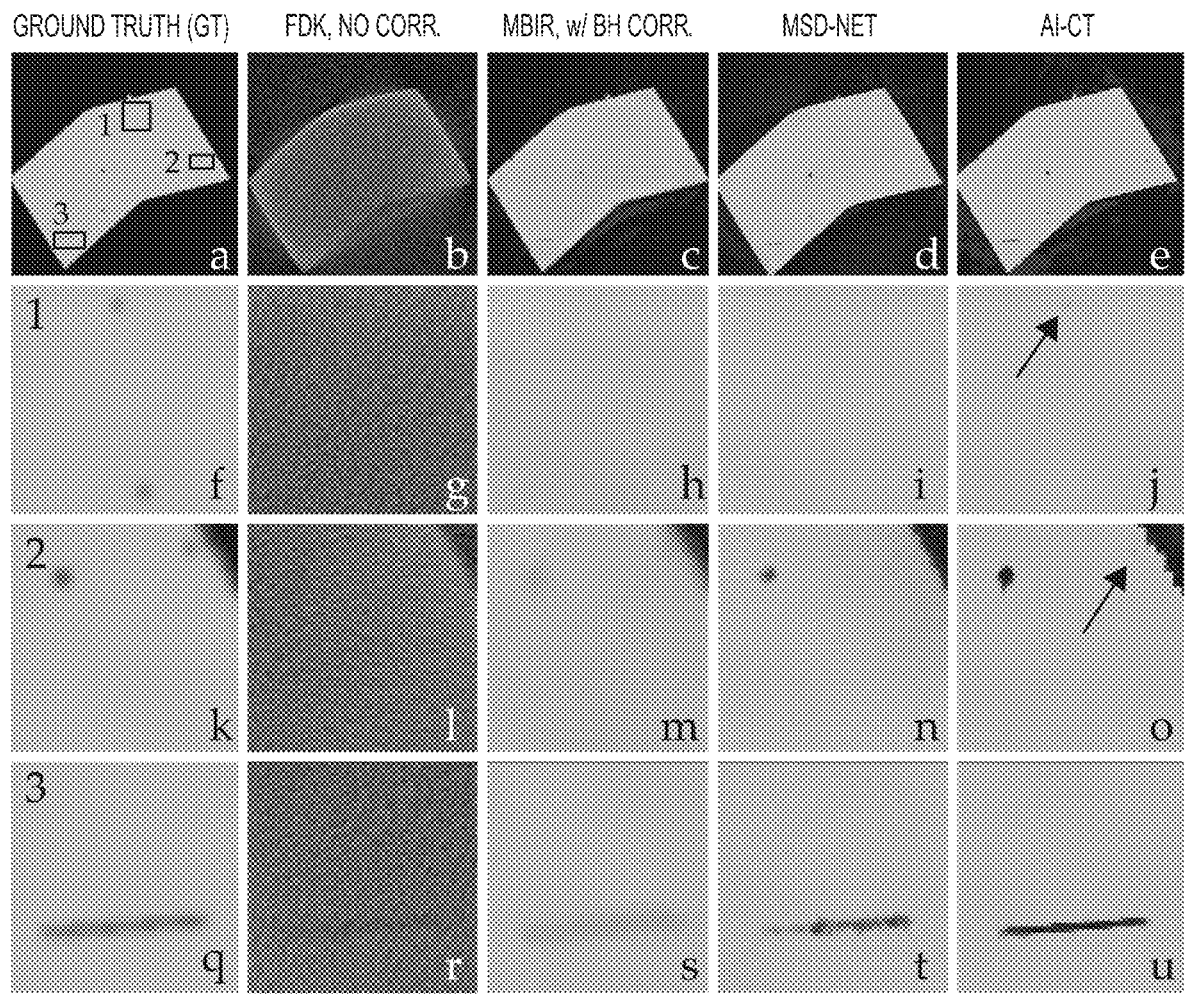
FIG. 8 shows a comparison of results from a proof of concept reconstruction where synthetic data was used for training and testing.
Figure 9:
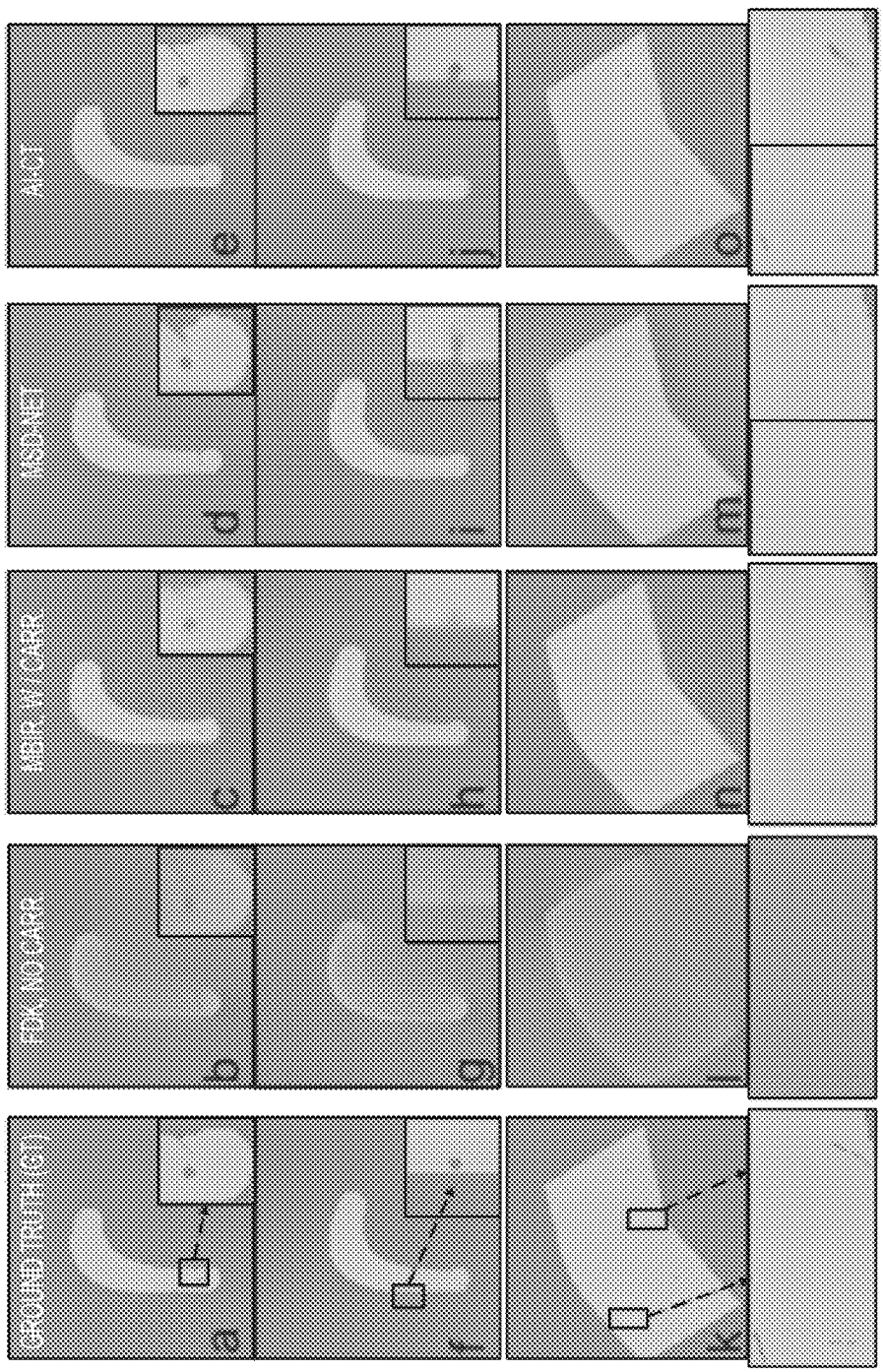
FIG. 9 shows another comparison of the results from a proof of concept reconstruction where synthetic data was used for training and testing.

The results for the reconstruction of two case studies between deep learning-based techniques and MBIR with beam hardening corrected projection are compared in FIGS. 8 and 9. In the comparison, the second case study is a volume with blurred defects, which make the reconstruction more challenging. FIG. 8 shows a slice near the bottom of the reconstructed blade for case study 1. The reconstruction was performed using FDK (without correction), MBIR (with corrected projection), MSD-Net, and AI-CT. Three regions of interest that include such defects were chosen for comparison, as shown in FIG. 8A. Both deep learning-based reconstruction techniques performed well, and AI-CT picked up pores that were not clear in the other reconstructions. It also produced a sharper reconstruction when reconstructing the defects. FIG. 8 shows in the top row labeled a-e a comparison among different methods for a single slice in the reconstruction volume. Rows 2-4 labeled f-u compare the results in the three regions of interest (1, 2, and 3) marked in panel a. Overall, AI-CT produces sharper reconstructions and identifies defects that are not visible in the other reconstructions (e.g., panels j and o).

FIG. 9 compares the methods for a more challenging case study in which the defects were blurred before modeling CT and applying beam hardening. Two slices in the airfoil region were selected labeled as panels a-e and f-j, respectively, and one slice near the bottom of the blades, labeled as panels k-o. Slices were selected specifically to make it challenging for all the algorithms to reconstruct the defects. For each case, the expanded views of the regions of interest are shown as insets for better comparison. Overall, AI-CT demonstrates consistent performance in reconstructing the CT volume of data and removing the artifacts and noise while restoring the defects more accurately. In essence, Fig. shows a comparison at slices in the airfoil region, (a-e) near center; (f-j) between center and bottom; and (k-o) near the bottom of the blade. The expanded views of the regions of interest are shown in the inset. The bottom row shows an example where all methods have difficulty in restoring the defects.

Quantitative comparisons among the methods along all the slices in the volume can also be made. A peak signal-to-noise-ratio (PSNR) is one metric for the quantitative comparison. The PSNR is calculated using $$PSNR \equiv 20\log\left(\frac{x_{GT,max}}{MSE}\right), \quad (7)$$

where mean squared error (MSE) is defined as $$MSE \equiv \frac{1}{N}\sum_{i=1}^{N}(x_{GT}(i) - x(i))^2,$$

and $x_{GT,max}$ is the maximum pixel value in the ground-truth image. Here, N is the total number of voxels, $x_{GT}$ is the voxel that belongs to the ground-truth volume, and x is the corresponding voxel in the reconstructed volume. To avoid voxels in the air or background of the image slices, only voxels that were within the CAD model region of the part were utilized. The PSNR values for AI-CT outperformed the other methods by at least 4 dB, highlighting its strength.

Mean PSNR And SSIM for Reconstruction Volumes

| Method | FDK, No Corr. | MBIR w/BH Corr | MSD-Net | AI-CT |
|---|---|---|---|---|
| Avg. PSNR (dB) (Case 1) | 16.42 | 36.52 | 37.24 | 53.11 |
| Avg. PSNR (dB) (Case 2) | 16.37 | 41.47 | 35.68 | 45.05 |

By simulating the CT system and beam hardening effect using CAD models trained neural networks, for example the proposed AI-CT method, it produced sharp and accurate reconstructions of simulated test data sets.

Figure 10:
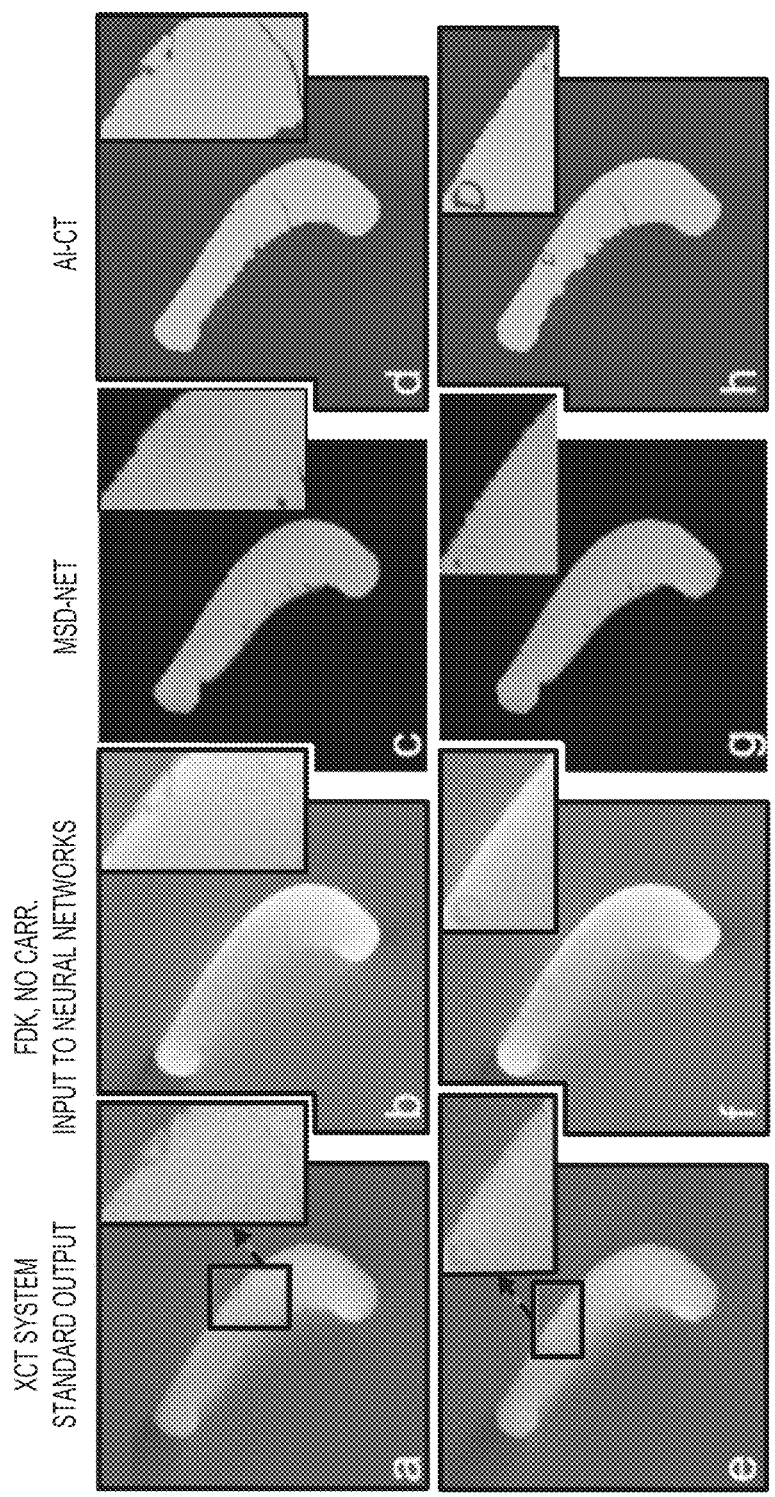
FIG. 10 shows a comparison of results including reconstruction of an image of the object of interest according to an embodiment of the present disclosure from an actual CT scan providing real CT projections using a deployed model trained on synthetic data to provide a reconstruction artifact correction.
Figure 11:
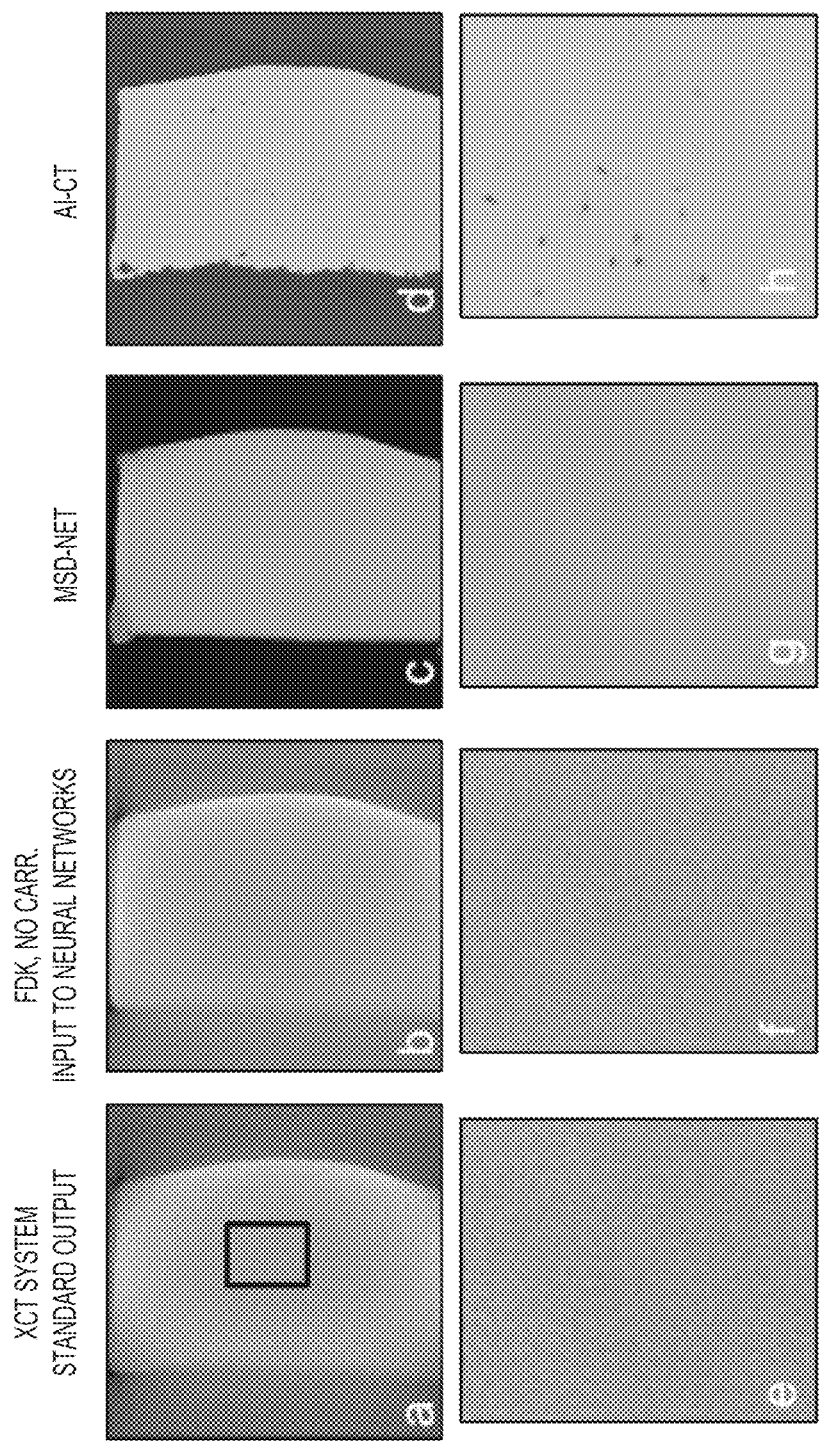
FIG. 11 shows another comparison of results including reconstruction of an image of the object of interest according to an embodiment of the present disclosure from an actual CT scan providing real CT projections using a deployed model trained on synthetic data to provide a reconstruction artifact correction.

In this section we address the accuracy of neural networks trained using synthetic data when applied to real CT data volumes of the part corresponding to the training CAD models. Acquiring and creating real labeled training data is labor intensive, expensive, and time consuming. Hence, having networks that are trained only on synthetic data and can be applied to real data is a significant goal. Through testing on the trained networks (MSD-Net and AI-CT) on a reconstruction of a turbine blade scanned at the MDF at ORNL using a ZEISS METROTOMCT system, results for some slices are shown in FIGS. 10 and 11. FIG. 10 shows two cross sections of the reconstructed volume in the airfoil region of the blade. The results are compared for the deep networks with the standard output of the CT system at the MDF. It is clear from FIG. 11 that even though AI-CT was trained only on synthetic data, it does an excellent job of reconstructing the blade and identifying the defects. These AI models may be further improved through better tuning of hyper-parameters during training. It should be emphasized that the networks of the current embodiment are trained only on synthetic data (i.e., simulated data), giving further significance to the results.

In FIG. 11, some pores and defects appear in the reconstructed slices at the bottom of the blade using AI-CT. Since a ground truth for real data is not available, the defects/holes cannot be repudiated as artificial features, or accepted as real defects invisible to standard techniques.

The results of this disclosure and its embodiments are unique and assist in leveraging CAD models for more consistent and precise characterization of CT scanned objects, such as CT scanned metal additive manufactured parts.

Removing/reducing beam hardening artifacts when dealing with CT reconstruction of metal parts generally increases the accuracy of characterization of the manufactured parts. This can work particularly well in connection with 3D printed or additively manufactured metal parts. Accurate characterization beyond current state-of-the-art is beneficial in advancing statistical analysis of defects such as pores and cracks in the manufactured parts, correlating them with 3D printing parameters, and in turn increasing the efficacy and consistency of the 3D printing process.

A fast and accurate deep learning-based technique can be beneficial in streamlining the process of characterization of several hundreds of parts being manufactured and characterized every day at manufacturing centers such as the Manufacturing Demonstration Facility (MDF).

Developing a deep learning method that is trained "only" on synthetic data, and can be employed for testing and analysis of real data represents a challenge in the artificial intelligence (AI) research domain. The systems and methods of the present disclosure can assist significantly in reducing the necessity of performing the cumbersome, labor-intensive and expensive task of curating real data sets for training a deep learning network, supervised or unsupervised.

The modularity of the proposed technique provides a plug-and-play framework that can take any state-of-the-art convolutional neural network (CNN) as a module and perform a high quality CT reconstruction of the 3D volume.

Embodiments of the present disclosure assist in reducing scan time and cost for non-destructive evaluation of parts; using a shorter scan time results in a lower quality analytical reconstruction, and as shown throughout the results section, AI-CT is trained to approximate the high quality reconstruction taking the low quality reconstruction as input.

While the present disclosure emphasizes characterization of additively manufactured metal parts, it is equally applicable to other areas such as medical imaging, nuclear engineering, security, electronic device manufacturing, and essentially any other place where XCT can be utilized to provide a characterization of an object of interest.

Even after four decades of development, beam hardening still is an unresolved challenge for CT of complex geometries of dense materials that are being used for metal additive manufacturing and in other areas. This disclosure describes how CAD models along with powerful deep learning neural networks can be leveraged to suppress artifacts, such as cupping and streaks caused by beam hardening, in reconstructed CT images. Simulated CT data with (and without) beam hardening and noise can be used to train a DNN, such as a convoluted neural network (CNN). Further, the trained model can produce high-quality reconstructions that resolve defects that are different, such as smaller, than those the network was trained on. Embodiments of this disclosure enable enhanced nondestructive evaluation and characterization of complex objects, such as 3D printed geometries.

Leveraging generative adversarial networks (GANs) and domain adaptation provides an avenue for implementing the technologies illustrated in FIGS. 16 and 17, which can be seen as an extension to FIG. 18.

Figure 20:
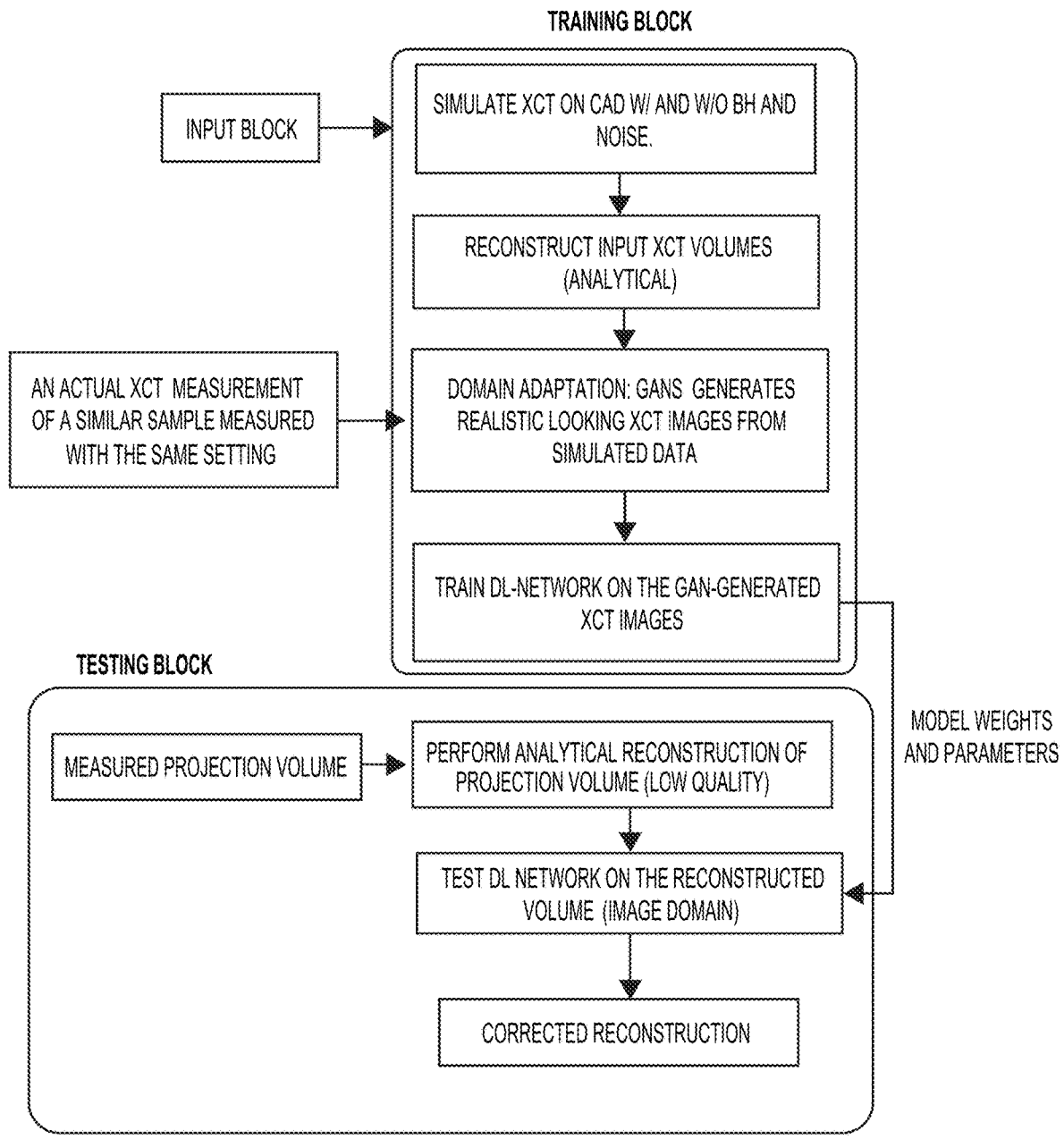
FIG. 20 shows one embodiment of the present disclosure with GAN-based Domain Adaptation.

FIG. 20 is a flowchart of a process in accordance with the technologies described herein that utilized GAN-based Domain Adaptation. Similar to the FIG. 18 flowchart, the process begins with a CAD model that is passed through a defect generator to simulate a defective additively manufactured part. An XCT measurement of the part is modeled under study with some default measurement setting, material properties and calibrated physics-based parameters modeling beam hardening and noise. While the simulated data incorporates physics and material properties of the parts, there can exist intrinsic differences with respect to real measurements due to presence of high frequency features/artifacts/noise in the latter. In addition, non-linearities such as beam-hardening and scatter associated with X-ray beam propagation cannot easily be incorporated into a simulation environment, and computationally expensive models, if possible at all, are generally required to perform such task. In this embodiment, the system characterizes the differences, also known as a domain-shift, between the reconstructions from simulated X-ray CT data and experimental CT data by use of a scattering wavelet transform. An unpaired image-to-image translation method, CycleGAN, can be configured to perform a domain adaptation task that compensates for the domain shift between the two reconstruction sources, and in turn to produce digital twins for the real X-ray CT reconstruction volumes. To that end, the simulation output along with a real 3D XCT measurement of an additively manufactured part is used to train a CycleGAN for performing domain adaptation. In this scenario, the network learns to modify the distribution of the source domain, e.g., simulated XCT volume, to adapt it to the target domain, e.g., the measured XCT volume. In this embodiment, training CycleGAN is unsupervised as the source and target data are an unpaired dataset. This trained domain adaptation CycleGAN is then used to generate realistic looking 3D XCT images from the input simulated data.

Figure 21A:
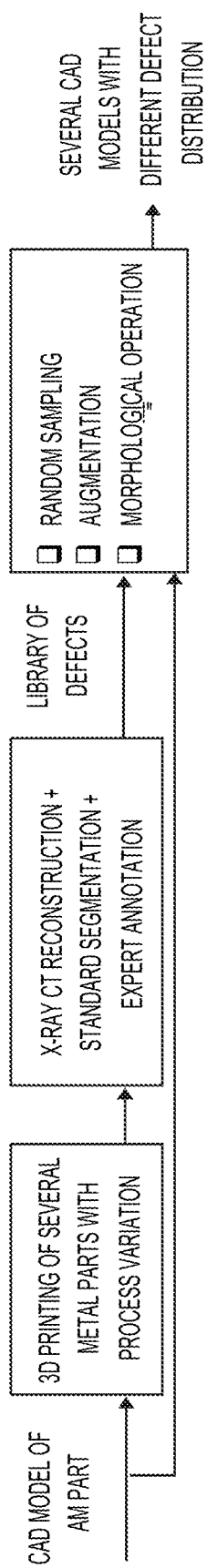
FIGS. 21A-C show a framework in accordance with an embodiment of the present disclosure to generate realistic digital twins of X-ray CT scans of additively manufactured parts
Figure 21B:
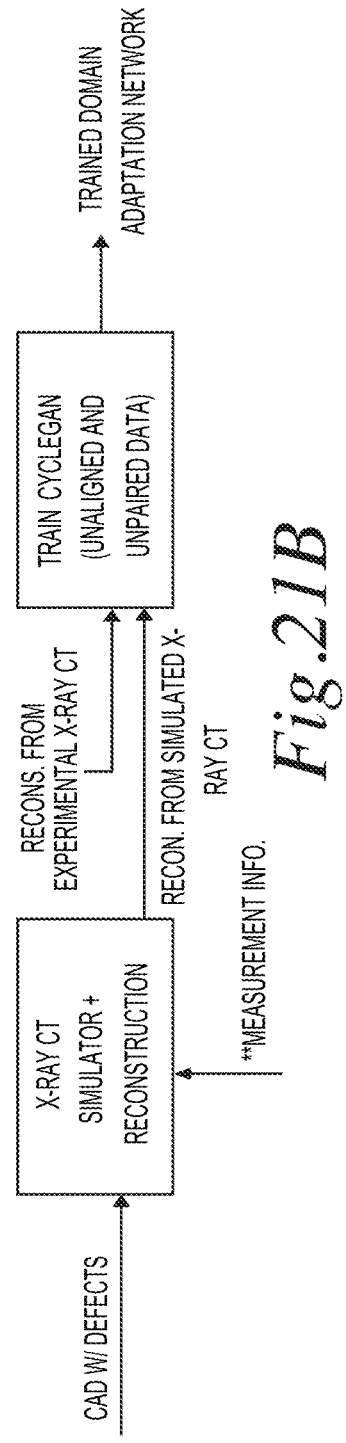
Figure 21C:
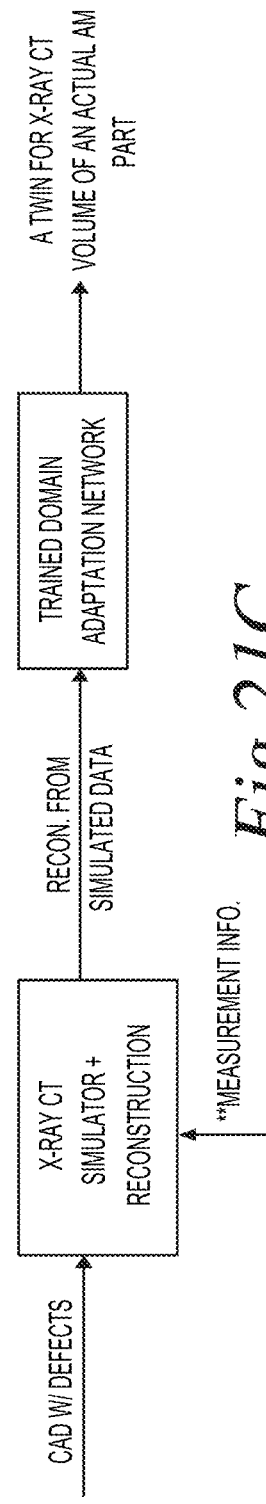

FIGS. 21A-C show an exemplary framework in accordance with an embodiment of the present disclosure to generate realistic-looking synthetic datasets with noise and artifacts, and with realistic defects/pores/crack shapes. That is, FIGS. 21A-C show an exemplary framework for generating twins of X-ray CT scans of additively manufactured parts.

The first stage, shown in FIG. 21A, involves using a CAD model to manufacture one or more representative samples, followed by an X-ray CT scan and extraction of defects such as pores and cracks. In the second stage, shown in FIG. 21B, the pores and crack morphology is used to create a more realistic 3D model of the part by embedding these defects into the CAD model. Then, in the third stage, shown in FIG. 21C, this improved digital model is then used to simulate X-ray CT measurements from which 3D reconstructions are obtained. This reconstruction from simulated data along with CT reconstructions from experimental data are used to train a cycleGAN in order to design a neural network that maps between the simulated and experimental domain. In the last stage, the trained cycleGAN is used to generate realistic looking X-ray CT reconstruction starting from a CAD model—thereby providing a valuable source of realistic CT scans that can be used to train downstream machine learning models for other image analysis tasks.

The measurement information utilized throughout the process can. include: material properties, beam hardening characterization data, and noise properties, to name a few different types of measurement information. In alternative embodiments, additional or different types of measurement information can be utilized.

Next, a pair of GAN-generated XCT volume and the input CAD model, with embedded defects, along with the physics-based beam hardening parameters are used to train the AI-CT, so the network learns to suppress noise and artifacts in the GAN-generated data to produce a high quality reconstruction. The trained network can be used on real XCT measurement of an additively manufactured part that is manufactured with the same material and scanned with the same settings.

This method can be evaluated by taking a CAD model, with no defects, of an additively manufactured part and printing several samples. Since no ground truth for reconstruction exists, an XCT of the samples at different resolutions, e.g., 3.8 µm and 11.5 µm, can be obtained. The first XCT measurement can be at a smaller FOV, such that the region of interest inside the field of view serves as a high-quality ground truth for the lower resolution measurement at the same region of interest. Two samples from the batch with low and high porosity can be selected. The low porosity sample can be used for domain adaptation using GAN. The other sample can be used to test the AI-CT.

FIGS. 22A-D show exemplary slices from a 3D volume. Specifically, FIGS. 22A-D show an example comparison in the region of interest. The region of interest in this example was measured at ~3× better resolution and every three slices in the high resolution (HR) images correspond to one slice from the low resolution (LR) images.

Figure 22A:
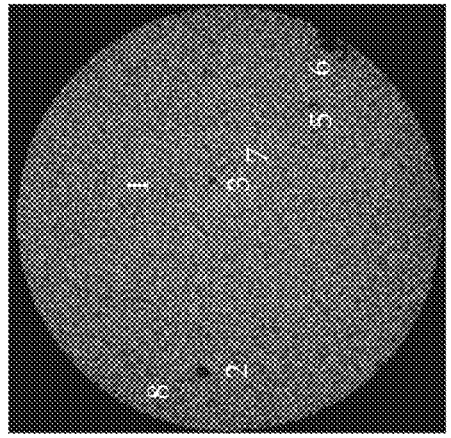
FIGS. 22A-D show three consecutive slices from the 3D volume at 3.8 μm resolution (HR data, a corresponding downsampled slice from HR data, a standard reconstruction from a measurement at 11.6 μm resolution (LR data), and an AI-CT output based on LR data as input.
Figure 22B:
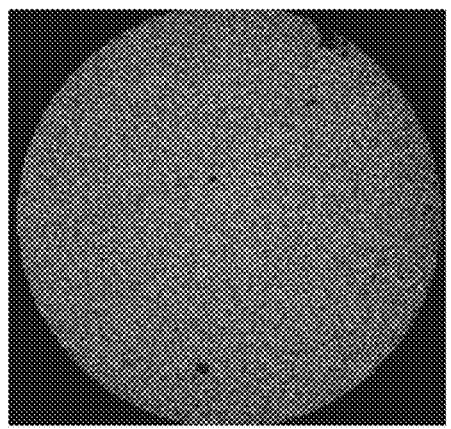
Figure 22B:
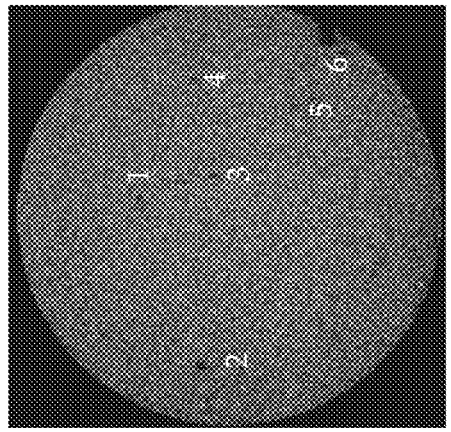

Three consecutive slices from the HR volume are shown in FIG. 22A. Specifically, FIG. 22A illustrates three consecutive slices from a 3D volume having a 980×1012 at 3.8 µm resolution (HR data). FIG. 22B illustrates a corresponding downsampled slice from the HR data of FIG. 22A. Specifically, the HR volume is interpolated (down-sampled) to one low resolution (LR, 322×333 at 11.6 µm resolution).

Figure 22D:
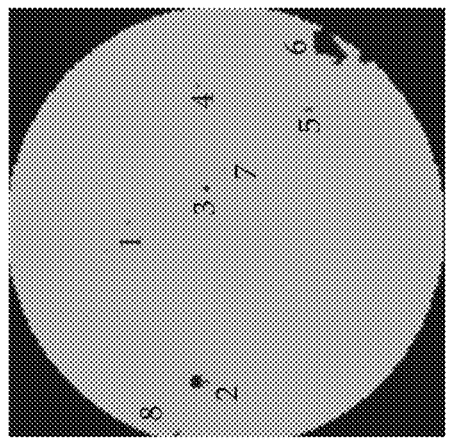
Figure 22C:
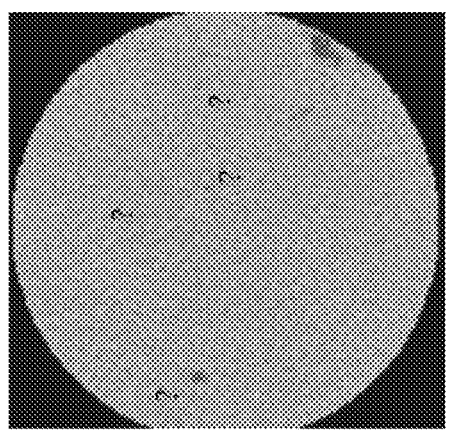

In contrast, FIG. 22C illustrates a slice from the output of a standard reconstruction algorithm. Specifically, FIG. 22C is reconstructed from a measurement of 322×333 at 11.6 µm resolution (LR data). The output volume is post-processed to remove beam hardening and metal artifacts. FIG. 22D is the corresponding slice from AI-CT with GAN-based Domain Adaptation. The sharpness, high quality, and low noise level is evident. In addition, the high-quality reconstruction has about three times the pore detection capability from the LR scan.

While the GAN model in this example is 2D, this process also works with 3D GAN models. Further, additional information, such as high resolution information and other imaging modalities, can be utilized to provide accurate data generation for training our algorithm.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. An artifact reduction artificial intelligence training system for computed tomography (CT) of an object of interest, the system comprising:
   a computer-aided design (CAD) model representing the object of interest, stored in memory;
   an artifact characterization, stored in memory;
   one or more computer subsystems; and
   one or more components executed by the one or more computer subsystems, wherein the one or more components include:
   a computed tomography (CT) simulator to generate a plurality of CT simulated projections based on the CAD model, wherein a subset of the plurality of CT simulated projections include simulated artifacts based on the artifact characterization, wherein the artifact characterization includes a set of beam-hardening parameters and detector noise parameters for simulating artifacts caused by beam hardening and detector noise during an actual CT scan, wherein the CT simulator is configured to generate at least a subset of the plurality of CT simulated projections based on the CAD model, the beam-hardening parameters, and the detector noise parameters, wherein the generated plurality of corresponding artifact CT simulated projections are realistically noisy, and wherein a subset of the plurality of the CT simulated projections lack simulated artifacts; and
   a deep learning component configured to train a deep learning artifact reduction model based on the plurality of CT simulated projections and generate a set of deep learning artifact reduction model parameters.

2. The artifact reduction artificial intelligence training system of claim 1 wherein the deep learning component is configured to reconstruct images of the object of interest based on the CT simulated projections and train the deep learning artifact reduction model in the image domain based on the reconstructed images.

3. The artifact reduction artificial intelligence training system of claim 1 wherein the deep learning component is configured to train the deep learning artifact reduction model in the sinogram domain based directly on the CT simulated projections.

4. The artifact reduction artificial intelligence training system of claim 3 wherein the deep learning component is configured to train the deep learning artifact reduction model without reconstruction of an image of the object of interest.

5. The artifact reduction artificial intelligence training system of claim 1 including a CT imaging system configured to perform a CT scan of a physical version of the object of interest and obtain CT measured projections, wherein the deep learning component is configured to process the CT measured projections to reduce artifacts based on the deep learning artifact reduction model and generate a reconstruction correction, and wherein the one or more components include a reconstruction component configured to reconstruct an image of the object of interest based on the reconstruction correction.

6. The artifact reduction artificial intelligence training system of claim 5 wherein the reconstruction component is configured to reconstruct an image of the object of interest without the reconstruction correction, compare the image reconstructed without the reconstruction correction and the image reconstructed with the reconstruction correction, and output the comparison.

7. The artifact reduction artificial intelligence training system of claim 5 wherein the reconstruction component is configured to reconstruct an image of the object of interest without the reconstruction correction, wherein artifacts in the reconstructed image without the reconstruction correction mask defects of the object of interest in the reconstructed image, and wherein defects of the object of interest are visible in the image reconstructed using the reconstruction correction that reduces the number of artifacts.

8. The artifact reduction artificial intelligence training system of claim 5 wherein the CAD model of the object of interest includes a set of defects positioned to be masked by artifacts created by the CT scan, and wherein the reconstructed image of the object of interest reduces the artifacts such that the set of defects in the object of interest are visible in the reconstructed image.

9. The artifact reduction artificial intelligence training system of claim 1 wherein the one or more components include a realistic defect generator configured to process the CAD model and generate one or more modified versions of the CAD model that represent the object of interest with different sets of simulated realistic defects, and wherein the CT simulator is configured to generate the plurality of CT simulated projections based on the one or more modified versions of the CAD model.

10. The artifact reduction artificial intelligence training system of claim 1 wherein the one or more components include a realistic defect generator configured to train a deep generative model based on the CAD model and one or more training representations derived from physically manufactured versions of the object of interest, wherein the one or more training representations include physical defects, and wherein the realistic defect generator is configured to generate a trained deep generative model with realistic defect model parameters that add realistic defects to representations of the CAD model.

11. The artifact reduction artificial intelligence training system of claim 10 wherein the one or more training representations includes at least one of a high-resolution CT image of the object of interest, a high-resolution scanning electron microscopy image of the object of interest, and a high-resolution transmission electron microscopy image of the object of interest.

12. The artifact reduction artificial intelligence training system of claim 1 wherein the one or more components include a resolution enhancing component configured to train a deep generative model based on the CAD model and one or more training representations derived from physically manufactured versions of the object of interest, wherein the one or more training representations are higher resolution than the CAD model, and wherein the resolution enhancing component is configured to generate a trained deep generative model with enhanced resolution model parameters that increase resolution of features of the CAD model.

13. The artifact reduction artificial intelligence training system of claim 1 wherein the deep learning component is configured to train the deep learning artifact reduction model without measured CT projections from an CT scan of a physical version of the object of interest.

14. The artifact reduction artificial intelligence training system of claim 1 wherein the one or more components include a transfer learning component configured to transform the set of deep learning artifact reduction model parameters trained on CT simulated projections of the object of interest to a set of deep learning artifact reduction model parameters for use on CT measured projections of a physical version of the object of interest.

15. The artifact reduction artificial intelligence training system of claim 1 wherein the artifact characterization includes a set of electronic noise parameters for simulating artifacts caused by electronic noise during an actual CT scan.

16. The artifact reduction artificial intelligence training system of claim 1 wherein the artifact characterization includes a set of CT scan time parameters for simulating artifacts caused by low scan time during an actual CT scan.

17. The artifact reduction artificial intelligence training system of claim 1 wherein the one or more components includes a deep learning deployment component configured to deploy the set of deep learning artifact reduction model parameters to suppress artifacts from reconstructed 3D volumes.

18. The artifact reduction artificial intelligence training system of claim 1 including a reconstruction component configured to reconstruct a 3D volume of the object of interest using a 2.5D scheme by which each slice of the 3D volume is reconstructed from multiple slices of an CT scan to exploit correlations between adjacent slices.

19. An artifact reduction artificial intelligence training method for computed tomography (CT) of an object of interest, the method comprising:
obtaining a computer-aided design (CAD) model representing a 3D volume of the object of interest, stored in memory;
obtaining an artifact characterization, stored in memory;
simulating a plurality of CT simulated projections based on the CAD model, wherein a subset of the plurality of CT simulated projections are artifact CT simulated projections that simulate artifacts based on a combination of the CAD model and the artifact characterization, wherein the artifact characterization includes a set of beam-hardening parameters and a set of detector noise parameters simulating artifacts caused by beam hardening and detector noise during an actual CT scan, wherein simulating a plurality of CT simulated projections comprises generating at least a subset of the plurality of CT simulated projections based on the CAD model, the beam-hardening parameters, and the detector noise parameters, wherein the generated plurality of artifact CT simulated projections are realistically noisy, and wherein a subset of the plurality of the CT simulated projections are non-artifact CT simulated projections that do not include simulated artifacts; and
training a deep learning artifact reduction model based on the subset of the plurality of artifact CT simulated projections and the subset of the plurality of non-artifact CT simulated projections; and generating a set of deep learning artifact reduction model parameters.

20. The artifact reduction artificial intelligence training method of claim 19 including reconstructing images of the 3D volume of the object of interest based on the subset of the plurality of artifact CT simulated projections and the subset of the plurality of non-artifact CT simulated projections, and wherein the training includes training the deep learning artifact reduction model based on the reconstructed images of the 3D volume of the object of interest.

21. The artifact reduction artificial intelligence training method of claim 19 wherein the CT simulated projections are a plurality of sinograms, and the training includes training the deep learning artifact reduction model directly on the plurality of sinograms.

22. The artifact reduction artificial intelligence training method of claim 21 wherein the training includes training the deep learning artifact reduction model without reconstruction of an image of the 3D volume of the object of interest.

23. The artifact reduction artificial intelligence training method of claim 19 including performing a CT scan of a physical version of the object of interest, obtaining CT measured projections of the 3D volume of the physical version of the object of interest, processing the CT measured projections to remove artifacts based on the deep learning artifact reduction model, generating a reconstruction artifact correction, and reconstructing an image of the 3D volume of the physical version of the object of interest based on the reconstruction artifact correction.

24. The artifact reduction artificial intelligence training method of claim 23 wherein the reconstructing includes reconstructing an image of the 3D volume of the physical version of the object of interest without the reconstruction artifact correction and providing a comparison between the reconstructed image of the 3D volume reconstructed without the reconstruction artifact correction and the reconstructed image of the 3D volume reconstructed with the reconstruction artifact correction.

25. The artifact reduction artificial intelligence training method of claim 23 including comparing the reconstructed image of the 3D volume with the reconstruction artifact correction and an image of the 3D volume representing ground truth, and outputting the comparison.

26. The artifact reduction artificial intelligence training method of claim 19 wherein the CAD model includes simulated defects representative of defects caused by additive manufacture of the object of interest.

27. The artifact reduction artificial intelligence training method of claim 19 including generating realistic defects by processing the CAD model and generating one or more modified versions or augmentations of the CAD model that represent the 3D volume of the object of interest with different sets of simulated realistic defects, and generating the plurality of CT simulated projections based on the one or more modified versions or augmentations of the CAD model with different sets of simulated realistic defects.

28. The artifact reduction artificial intelligence training method of claim 19 including generating realistic defects, training a generative-adversarial neural network (GAN) based on one or more training CAD models and one or more training representations derived from physical versions of the object of interest, wherein the one or more training representations include physical manufacturing defects, and generating a trained GAN model with realistic defect model parameters that modify an input CAD model with realistic manufacturing defects, and generating the plurality of CT simulated projections based on the modified input CAD model.

29. The artifact reduction artificial intelligence training method of claim 28 wherein the one or more training representations includes at least one of a high-resolution CT image, a high-resolution scanning electron microscopy image, and a high-resolution transmission electron microscopy image.

30. The artifact reduction artificial intelligence training method of claim 19 including generating realistic defects, training a generative-adversarial neural network (GAN) based on a generative model and a discriminative model, wherein the generative model represents actual XCT measurements of a physical instance of the object of interest and the discriminative model represents the CT simulated projections of the CAD model of the object of interest, and generating a trained GAN model with realistic defect model parameters that modify an input CAD model with realistic manufacturing defects to generate GAN-generated XCT images, and wherein training the deep learning artifact reduction model includes training the deep learning artifact reduction model based on GAN-generated XCT images.

31. The artifact reduction artificial intelligence training method of claim 19 including training the deep learning artifact reduction model without the use of CT measured projections from a CT scan of a physical version of the object of interest.

32. The artifact reduction artificial intelligence training method of claim 19 including transfer learning the set of deep learning artifact reduction model parameters trained on CT simulated projections to a set of deep learning artifact reduction model parameters for use on CT measured projections of a physical version of the object of interest.

33. The artifact reduction artificial intelligence training method of claim 19 wherein the artifact characterization includes a set of beam-hardening parameters and a set of detector noise parameters.

* * * * *